United States Patent [19]

Burns et al.

[11] Patent Number: 4,698,587

[45] Date of Patent: Oct. 6, 1987

[54] METHOD OF CHARACTERIZING CRITICAL TIMING PATHS AND ANALYZING TIMING RELATED FAILURE MODES IN VERY LARGE SCALE INTEGRATED CIRCUITS

[75] Inventors: Daniel J. Burns; Charles A. Eldering, both of Rome; Mark T. Pronobis, Lee, all of N.Y.

[73] Assignee: The United States of America as represented by the Secretary of the Air Force, Washington, D.C.

[21] Appl. No.: 716,863

[22] Filed: Mar. 28, 1985

[51] Int. Cl.[4] ............... G01R 31/28; G01N 23/00
[52] U.S. Cl. ........................ 324/73 R; 324/158 T; 324/158 D; 324/158 R; 250/310; 250/311
[58] Field of Search ............ 324/158 D, 158 T, 73 R, 324/158 R, 73 PC; 250/310, 311

[56] References Cited

U.S. PATENT DOCUMENTS

| | | | |
|---|---|---|---|
| 2,790,952 | 4/1957 | Pietenpol | 324/158 |
| 3,461,547 | 8/1969 | Di Curcio | 29/574 |
| 3,803,413 | 4/1974 | Vanzetti et al. | 250/338 |
| 3,969,670 | 7/1976 | Wu | 324/73 PC |
| 4,172,228 | 10/1979 | Gauthier et al. | 324/158 T |
| 4,182,024 | 1/1980 | Cometta | 29/571 |
| 4,332,833 | 6/1982 | Aspnes et al. | 427/8 |
| 4,380,864 | 4/1983 | Das | 29/574 |
| 4,454,585 | 6/1984 | Ele | 364/507 |
| 4,588,950 | 5/1986 | Henley | 324/158 D X |
| 4,599,558 | 7/1986 | Castellano, Jr. et al. | 324/158 D |
| 4,642,566 | 2/1987 | Fazekas | 324/158 R |

OTHER PUBLICATIONS

Pronobis, Mark T. et al, "Laser Die Probing for Complex CMOS," *Proceedings of the International Symposium for Testing and Failure Analysis*, Oct. 1982.

Shichman, Harold et al, "Modeling and Simulation of Insulated-Gate Field-Effect Transistor Switching Circuits," *IEEE Journal of Solid State Circuits*, Sep. 1968, pp. 285–289.

Henley, F. J., "Logic Failure Analysis of CMOS VLSI Using a Laser Probe", *IEEE 22nd Annual Proceedings Reliability Physics*, Apr. 3, 4, 5, 1984.

*Primary Examiner*—Gerard R. Strecker
*Assistant Examiner*—Vinh P. Nguyen
*Attorney, Agent, or Firm*—Jacob N. Erlich; Donald J. Singer

[57] ABSTRACT

A method for characterizing critical timing paths and analyzing timing related failure modes in high clock rate photocurrent at the drain of a single transistor in a very large scale integrated circuit. The laser testing apparatus utilized with the method of this invention incorporates therein a laser having its output beam focused onto the drain junction of the transistor under test. The localized injection of electromagnetic radiation produces a photocurrent at the drain junction of the transistor at specific times during the testing procedure which increases the logic level transition times associated with that particular node. This causes an increase in the minimum operating power supply and/or a decrease in the maximum operating frequency at which the microcircuit will properly function. Consideration of these parameters and the level of photocurrent provide a measurement related to the worst case timing margin which occurs during the functional test of the integrated microcircuit.

19 Claims, 5 Drawing Figures

METHOD OF CHARACTERIZING CRITICAL TIMING PATHS AND ANALYZING TIMING RELATED FAILURE MODES IN VERY LARGE SCALE INTEGRATED CIRCUITS

STATEMENT OF GOVERNMENT INTEREST

The invention described herein may be manufactured and used by or for the Government for governmental purposes without the payment of any royalty thereon.

BACKGROUND OF THE INVENTION

This invention relates generally to test systems for integrated cicuits, and, more particularly, to a laser testing method for characterizing critical timing paths and analyzing timing related failure modes in high clock rate very large scale integrated microcircuits.

One of the most important requirements in the design and production of complex integrated microcircuits is to understand and control critical timing paths in the circuit. Timing analysis for portions of a microcircuit may be performed with circuit simulators, however, the complexity and shear size of a very large scale integrated microcircuit tends to place limitations on the use of such simulators. For example, such simulators may not include mechanisms for modeling "macro" effect on circuit performance such as substrate current distribution, power supply bussing, temperature patterns and patterns of gate delays which depend on starting materials or processing. Furthermore, there is a need for experimental measurement techniques for verifying such simulations done to identify critical internal timing paths in finished microcircuits.

In addition, a need exists in the area of acceptance testing of finished products. When performing electrical testing on large scale integrated circuits (microcircuits) or very large scale integrated circuits (microcircuits) the majority of the internal timing paths are not characterized with respect to internal timing conditions. Functional testing has done little more than validate the device truth table and perhaps test for certain data pattern sensitivities. While this has been sufficient for small scale technologies it does not provide an adequate performance screen for more complex devices. Even further, there exists a need for techniques useful for analyzing failed parts which exhibit frequency sensitivity failure modes. These may be much more difficult to analyze than catastrophic failures because the failure site may not have any distinguishing visual characteristics. Consequently, internal node electrical testing techniques are essential in locating the failure site. Non-destructive, automated techniques are therefore clearly needed in this area.

A basic problem in satisfying all of these needs is the difficulty of making reliable electrical measurements internally in a operating circuit. Low capacitance mechanical die probing is widely used but it is difficult to do quickly and non-destructively at many internal circuit nodes and would be difficult to automate.

SUMMARY OF THE INVENTION

The present invention overcomes the problems encountered in the past and as set forth in detail hereinabove by providing an integrated microcircuit testing technique based upon the injection of laser photocurrent at the drain junction of a transistor which controls the logic state of the internal node of interest in the integrated microcircuit.

The method of the present invention utilizes a source of electromagnetic radiation, preferably in the form of a helium-neon laser, which is focused onto the drain junction of a transistor of the integrated microcircuit under test. Photogenerated carriers in the silicon making up the transistor are collected by the illuminated drain junction depending upon the logic state of the transistor. This effectively loads the node and perturbs logic level transistion times during testing.

More specifically, the localized injection of electromagnetic radiation producing a photocurrent at the drain junction of the transistor at specific times during the testing procedure increases the logic level transistion times associated with that particular node. This causes an increase in the minimum operating power supply and/or a decrease in the maximum operating frequency at which the microcircuit will properly function. Consideration of these parameters and the level of photocurrent provide a measurement related to the worst case timing margin which occurs during the functional test of the integrated microcircuit. Such measurements may be repeated on different transistors and on different microcircuits to gain knowledge about the effectiveness of design, fabrication process drifts, sensitivity to failure mechanisms and sensitivity to marginal operating conditions related to the environment such as temperature or electrical noise.

The utilization of a laser beam within the present invention allows for a non-destructive, non-contacting means for perturbing the operation of the internal circuitry in a microcircuit. The laser beam accomplishes this end in a controlled manner so as to obtain a measurement related to the timing margin associated with an internal node that may be deep within the microcircuit. Furthermore, as a result of the unique system of testing provided by the present invention, information can be obtained about the microcircuit without a detailed knowledge of the circuit itself. Consequently, a user of the testing system of the present invention who needs information with respect to a microcircuit, but who did not design this particular microcircuit and may not understand its detailed operation, may still effectively use the present testing system.

Stated more succinctly, the present invention solves the problem of characterizing critical timing paths in complex devices for which detail design data is not available in a procedure that is non-contacting and non-destructive. Since the timing margins measured are related mathematically to critical physical parameters of the transistors tested, the invention provides, for the first time, a non-contacting means for identifying internal transistors with abnormal physical parameters. In addition, the system of the present invention measures true device behavior and is not limited by imperfect models that are used in timing analysis by computer simulation.

It is therefore an object of this invention to provide a method for analyzing very large scale integrated microcircuits.

It is another object of this invention to provide a laser testing method for very large scale integrated microcircuits which is completely non-destructive and non-contacting.

It is a further object of this invention to provide a laser testing method for microcircuits capable of obtaining a measurement related to the timing margin associated with an internal node that may be deep within the microcircuit.

It is still another object of this invention to provide a laser testing method for microcircuits which is capable of characterizing critical timing paths in complex microcircuits.

It is an even further object of this invention to provide a laser testing method for very large scale integrated microcircuits which utilizes conventional, currently available components during the testing procedure.

For a better understanding of the present invention, together with other and further objects thereof, reference is made to the following description, taken in conjunction with the accompanying drawings and its scope will be pointed out in the appended claims.

DETAILED DESCRIPTION OF THE PREFERRED METHOD

Figure 1:
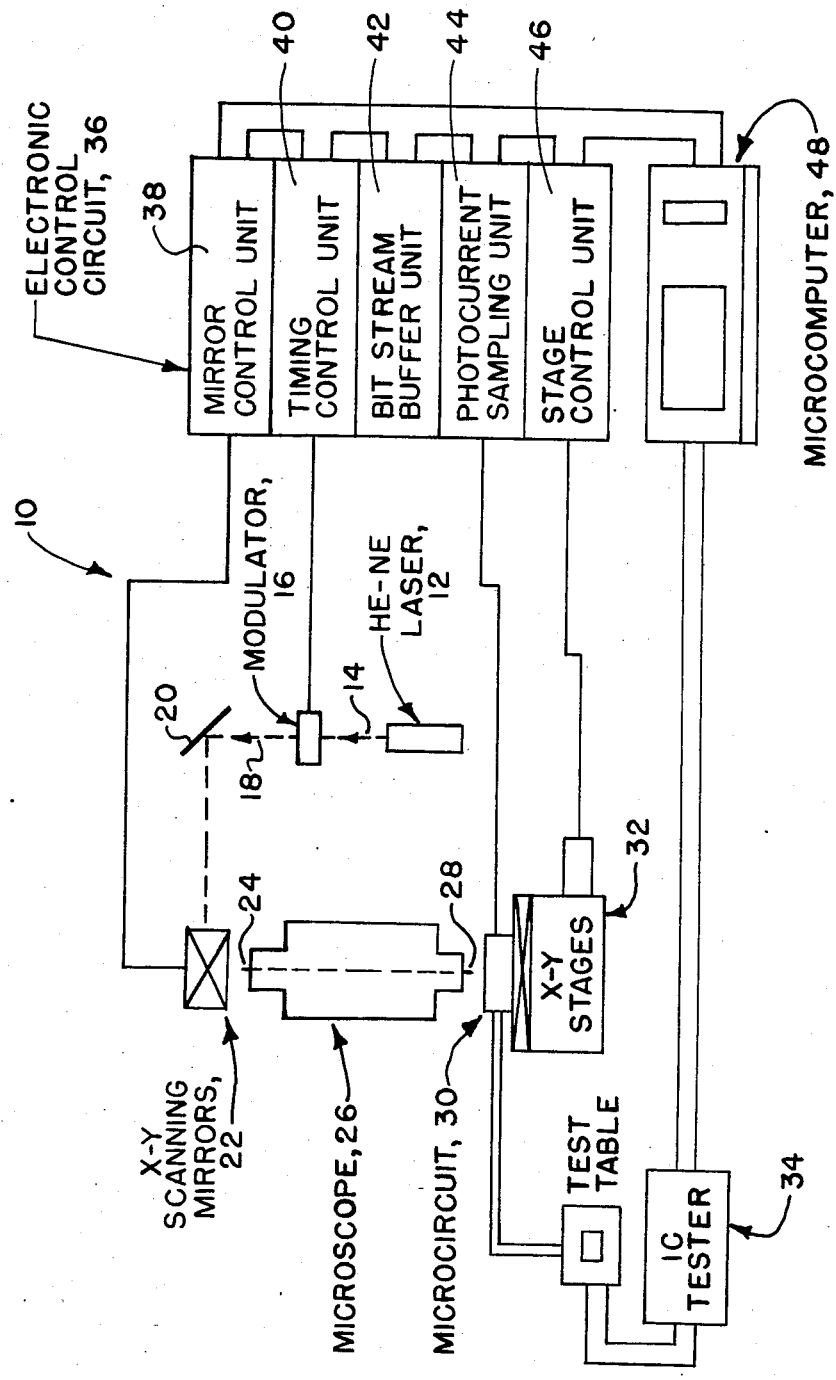
FIG. 1 is a schematic illustration of the laser test apparatus utilized with the method of the present invention capable of analyzing very large scale integrated microcircuits.

In order to more clearly understand the method of the present invention reference is first made to the laser testing apparatus 10 utilized with the present method. More particularly, laser testing apparatus 10 incroporates therein a source of electromagnetic radiation preferably in the form of a helium-neon laser 12. Laser 12 preferably operates at 0.5 milliwatts and at a wavelength of 6328 angstroms. However, it should be realized that the above-mentioned parameters of power and wavelength for laser 12, although desirable, may vary within the confines of the present invention.

Laser 12 is optically aligned or positioned within apparatus 10 so as to direct its electromagnetic beam of radiation 14 through a modulator 16. An example of such a modulator would be a Crystal Technology 3080 acousto-optic modulator having a 1380B modulator driver or, more simply stated, an acousto-optic Bragg cell. The output 18 from modultor 16 is directed (deflected) by any conventional reflecting means in the form of mirror 20 to a set of X-Y scanning mirrors 22. More particularly, scanning mirrors 22 can be in the form of a General Scanning CCX-650T optical galvanometer scanner drive amplifierand a General Scanning G-100PBT galvenometer mirror positioning device.

Optically aligned with the output 24 of scanning mirrors 22 is a metallurgical microscope 26, preferably in the form of a Leitz Orthoplan microscope. Micro 26 is capable of focusing the beam 28 output therefrom to an extremely fine spot (about 2 microns in diameter) on the surface of the microcircuit 30 under test.

As illustrated in FIG. 1 of the drawings the microcircuit 30 is plugged into a socket forming part of two directional (X-Y) stepper stages 32. The X-Y stepper stages 32 can be in the form of Aerotech ATS302MNSW stepper stages each having an optical encoder. The socket forming part of X-Y stepper stages 32 is wired to a conventional integrated circuit tester 34. The integrated circuit tester 34 may be, for example, in the form of a Tektronix S-3260 automatic IC tester having a 1803 tester station. Circuit tester 34 is capable of running functional tests on microcircuit 30 using various power supply voltages and operating frequencies.

Also, electrically interconnected with the various components mentioned above is an electronic control circuit 36 made up of a mirror control unit 38, a timing control unit 40, a bit stream buffer unit 42, a photocurrent sampling unit 44, and a stage control unit 46; and a microcomputer 48, all of which will be described in greater detail hereinbelow. It is the purpose of the electronic control circuit 36 to convert the microcircuit supply current to a voltage, to sample this voltage in synchronism with the beam of electromagnetic radiation 28 from laser 12, to subtract, threshold detect and to convert these measurements to logic levels, to store sequences of thousands of these logic level measurement, to gate the laser 12 on the off, to interface these units to microcomputer 48 and to also interface microcomputer 48 to the integrated circuit tester 34.

More specifically, mirror control unit 38 is interconnected to scanning mirrors 22 so as to control the movement thereof while the stage control unit 46 is interconnected to the X-Y stages 32 for its control. The remaining three control units, in the form of timing control unit 40, bit stream buffer unit 42 and photocurrent sampling unit 44 are illustrated schematically in FIGS. 2, 3 and 4 of the drawings, respectively.

Figure 2:
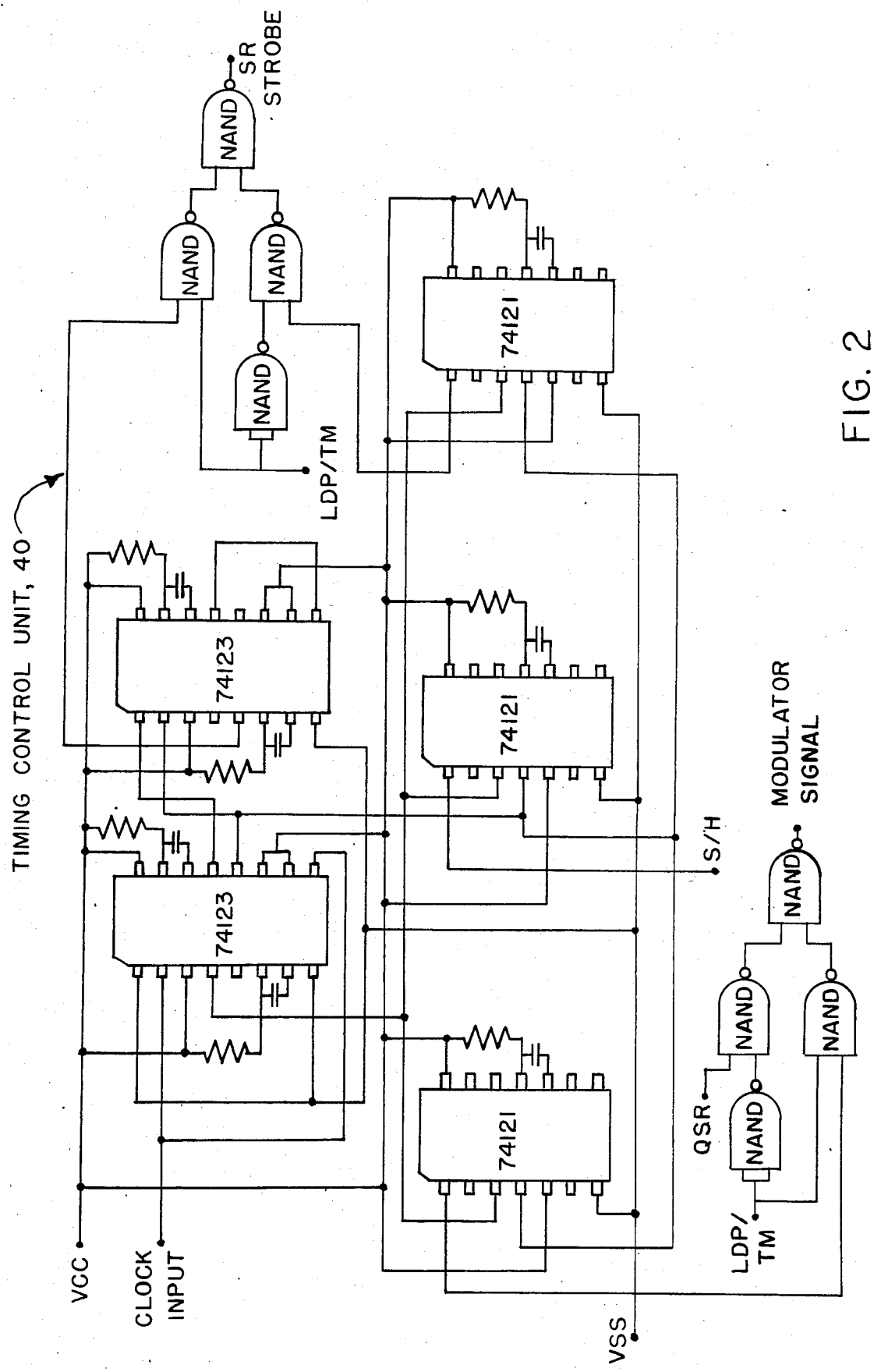
FIG. 2 is an electrical circuit diagram representative of a timing control unit which can be utilized with the laser test apparatus of the method of the present invention.
Figure 3:
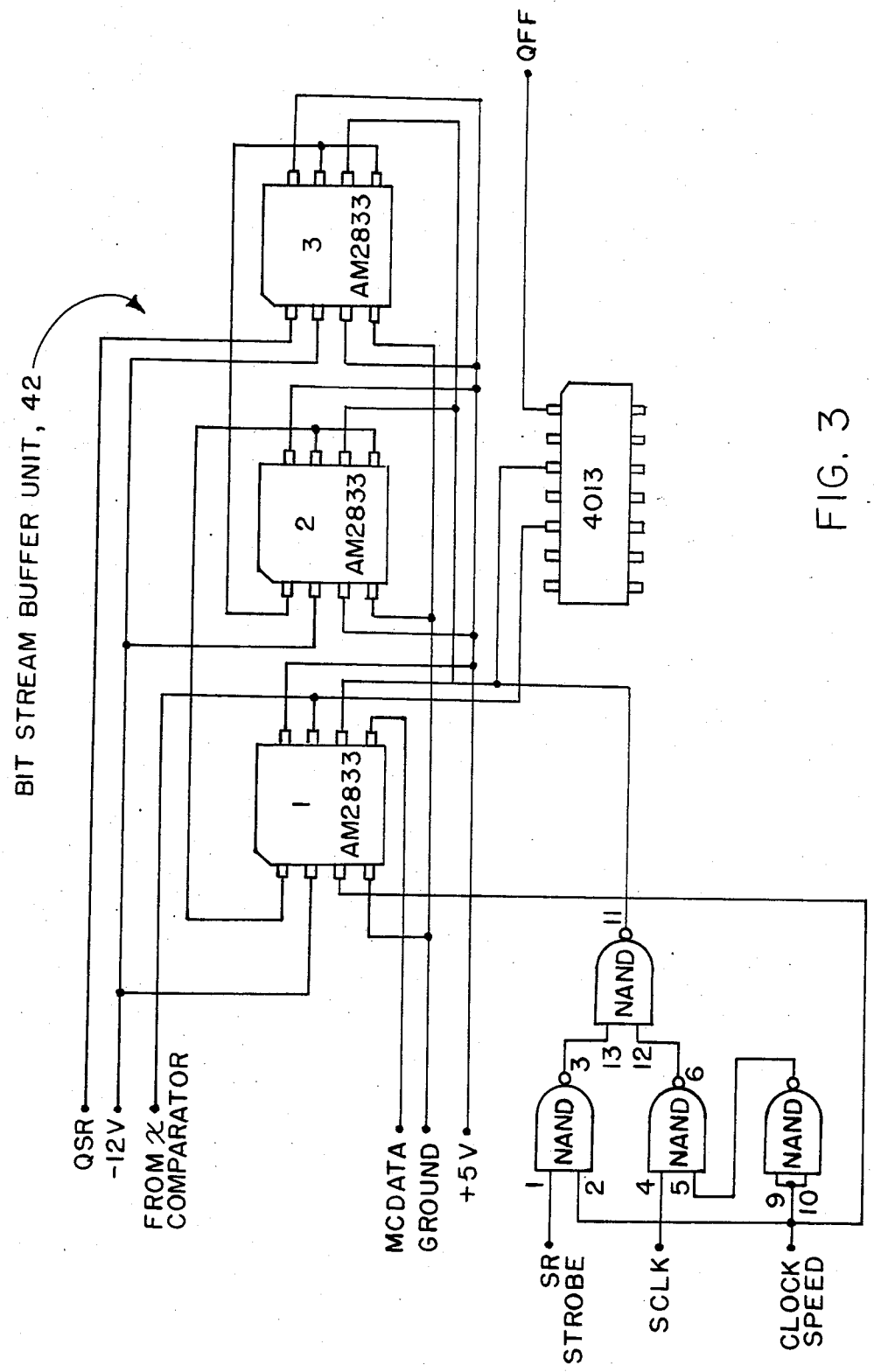
FIG. 3 is an electrical circuit diagram of a bit stream buffer unit which can be utilized with the laser test apparatus of the method of the present invention.
Figure 4:
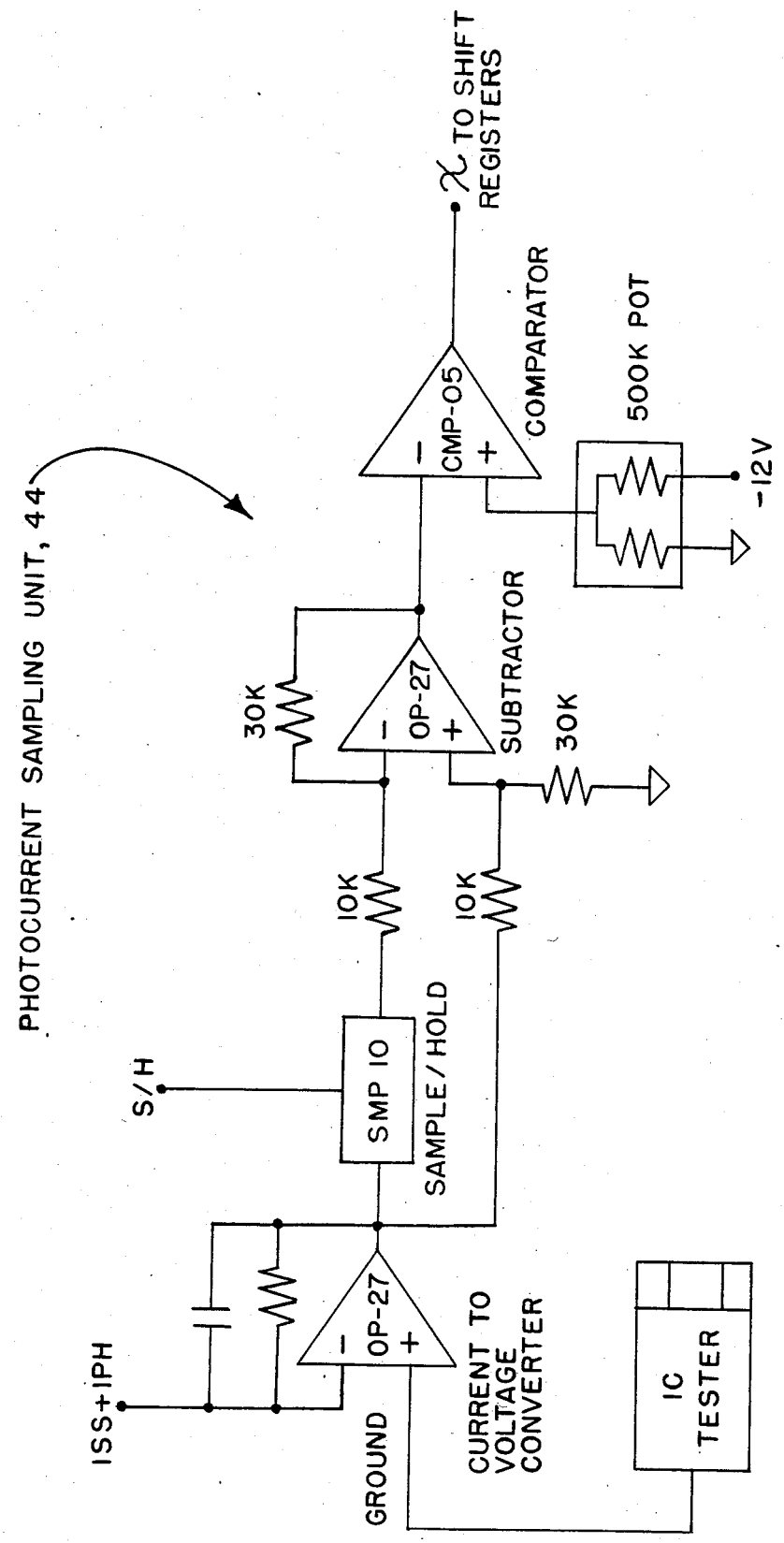
FIG. 4 is an electrical circuit diagram of a photocurrent sampling unit which can be utilized with the laser test apparatus of the method of the present invention.

These particular units 40, 42 and 44 may be varied within the scope of this inventio, however, typical units are illustrated in FIGS. 2–4 in order to provide an example of operative control units capable of use within the method of the present invention.

Within timing control unit 40 shown in FIG. 2 of the drawings all resistors are 10,000 ohm variable resistors while all capacitors are 0.01 microfarads, with integrated circuits 74123 being conventional dual retriggerable resettable multivibrators and integrated circuits 74121 being conventional multivibrators. Bit stream buffer unit 42 illustrated in FIG. 3 of the drawings incorporates therein integrated circuits AM2833 and 4013 which are in the form of conventional 1024 bit static shift registers and D type flip flops, respectively. In photocurrent sampling unit 44 of FIG. 4 of the drawings the following conventional integrated circuits are used: OP-27 (operational amplifier), SMP 10 (sample and hold amplifier) and CMP-05 (comparator).

Referring now specifically to the method of the present invention, it is pointed out that timing problems arise in a circuit (microcircuit) when a logic level transition at a gate output does not occur by the time it is sampled or stored by some other part of the circuit. A logic error occurs which propagates through the circuit. The difference between the actual time in which the gate output transition is complete and the maximum time allowed by the design and operating frequency is referred to as the timing "slack" or "margin." For a particular gate it depends upon the gate's propagation delay and settling times of its inputs, which in turn depend on sums of other gate propagation delays. Each gate has a specific timing margin associated with each transition of its output during a full test of the circuit. The minimum of these margins is referred to as the cirucit's critical timing margin an its value determines the circuit's maximum operating frequency.

The maximum operating frequency of a circuit (microcircuit) is expressed as some complex function of equations for gate propagation delays and the boolean equations describing the logic function of the entire circuit. In the past to simulate and analyze the timing of all nodes in a complex device one would need a full knowledge of the circuit, perfect gate models and a large amount of simulation time. A good design analysis might also include simulations of "worst case" distributions of process related patterns of transistor parameters across the device where they are known to occur and have a significant effect on timing.

Within the method of the present invention, laser 12 is utilized to generate very localized quantities of free hole-electron pairs in silicon. These carriers normally diffuse away from the generation volume and simply recombine. However, if they encounter an electric field, specifically in the depletion region of a reversed bias junction, they may be separated, collected and forced onto an internal circuit node as additional junction leakage current. The effect of this photocurrent depends on the circuit, and often it affects transition times. Both rise and fall times can be increased or decreased in simple CMOS gates. In NMOS it is likely that fall times can only be decreased and that rise times can only be increased but this depends on the particular circuit design.

In order to develop a qualitative analysis of the effect of injected photocurrent (as with the laser beam in the method of the present invention) on the propagation delays of a CMOS inverter, a simple circuit model can be used which takes into account the primary factors which determine switching speeds. In so doing, it is possible to study the high to low transition and then consider the effect of photocurrent generated at the p-channel transistor drain to substrate junction. Similar arguments can be made for the low to high transition with photocurrent generated at the n-channel transistor drain.

When the output is switched from high to low, the n-channel transistor turns on and the p-channel transistor turns off. It can be assumed in such a simple model that this happens immediately and that afterwards the p-channel transistor acts as an open circuit and the n-channel transistor acts as a constant current source.

Figure 5:
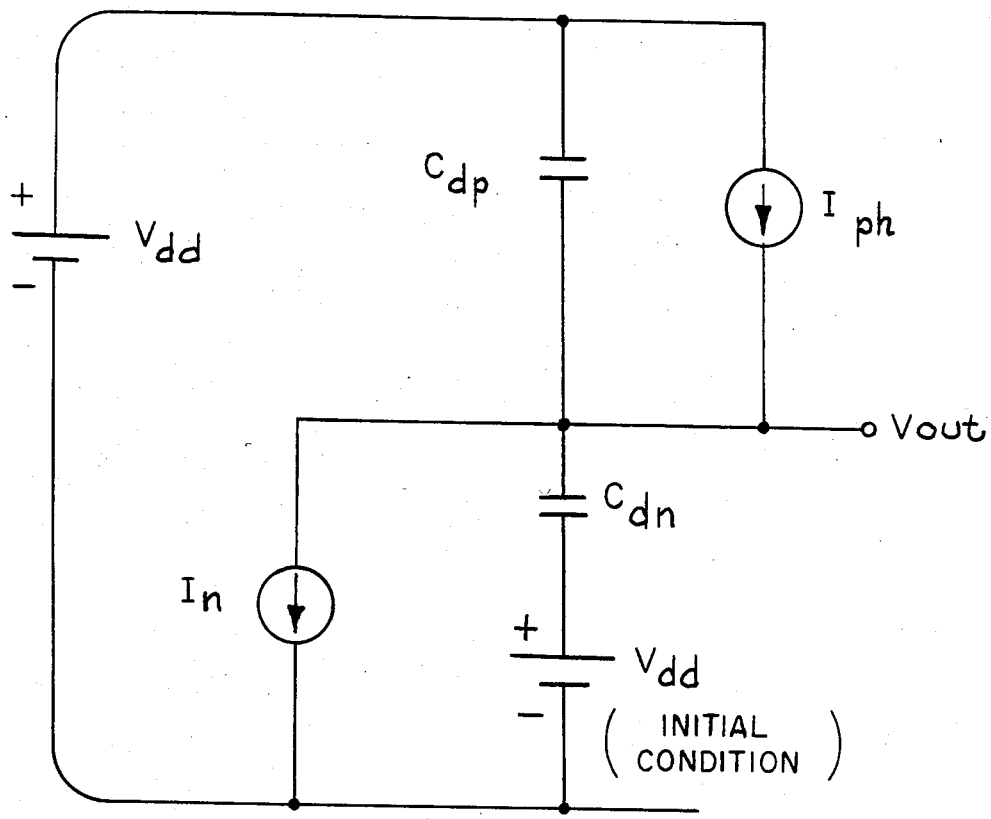
FIG. 5 is a circuit diagram of a simplified circuit utilized for analyzing the effect of injected photocurrent on high to low propagation delay within the method of the present invention.

Reference is now made to FIG. 5 of the drawings which represents such a simplified circuit 50 for analyzing the effect of injected photocurrent on high to low propagation delay.

The output voltage decays from $V_{dd}$ as the on n-channel transistor discharges the node capacitance, here mainly the drain-substrate junction capacitances of the two transistors ($C_{dp}$ and $C_{dn}$ respectively). The linear portion of the output voltage is found to be $$V_{out} = V_{dd} - \frac{t(I_n - I_{ph})}{C} \quad \text{(Eq. 1)}$$

where $C = C_{dp} + C_{dn}$; $I_n$ = saturatred channel current; $I_{ph}$ = photocurrent and t = time. If we define the propagation delay to be the amount of time required for the output to decay to one half of $V_{dd}$, then the propagation delay $T_{phl}$ is $$T_{phl} = \frac{CV_{dd}}{2(I_n - I_{ph})} \quad \text{(Eq. 2)}$$

and substituting $I_n = K(V_{gs} - V_{thn})^2$ and $V_{gs} = V_{dd}$ (true for a CMOS inverter), $$T_{phl} = \frac{CV_{dd}}{2(K(V_{dd} - V_{thn})^2 - I_{ph})} \quad \text{(Eq. 3)}$$

It is clear that when the magnitude of the photocurrent $I_{ph}$ approaches that of the channel current $I_n$, the propagation delay can be increased greatly. This can be accomplished by increasing the injected photocurrent $I_{ph}$ or by decreasing the channel current by lowering the power supply voltage $V_{dd}$ closer to the threshold voltage $V_{thn}$.

Based upon the above analysis the following detailed description of the method of the present invention can be more readily understood. It should be pointed out, however, that additional substantiation of the results produced by the method of the present invention can be found in a paper by the present inventors, Daniel J. Burns et al, "Reliability/Design Assessment by Internal-Node Timing-Margin Analysis Using Laser Photocurrent-Injection," *IEEE 22nd Annual Proceedings Reliability Physics*, April 1984, pp. 76–82, which is incorporated herein by reference.

Reference is once again made to FIG. 1 of the drawings for a fuller understanding of the particular method of the present invention. Initially, microcircuit 30 to be tested is plugged into the socket located on the X-Y stages 32 which are utilized to position a desired area of microcircuit 30 in the field of view of microscope 26. The X-Y scanning mirrors 22 under the control of mirror control unit 38 positions the electromagnetic beam of radiation 28 to a particular spot also referred to as the gate output (the drain or gate junction for MOS technology or the collector for bipolar technology, for example) of a transistor to be tested within microcircuit 30. This spot is focused to minimum diameter by microscope 26. Normally, the electromagnetic beam of radiation 28 is attenuated with a neutral density filter (not shown) during positioning in order to avoid exposure of microcircuit 30 to the strong beam of electromagnetic radiation 28.

During the testing procedure, laser 12 is controlled by timing control unit 40 and microcircuit 30 is functionally tested by the conventional IC tester 34. During this functional test, the logic level sequence of the specific transistor within the microcircuit under test is analyzed and stored by the electronic control circuit 36 and microcomputer 48. Stated more succinctly, the logic level sequence refers to the sequence of logic levels (HI or LOW) or electrical states (ON or OFF) which characterize the behavior of an individual internal transistor during the functional test of the overall microcircuit 30. For example, in the case of a microprocessor integrated microcircuit, such a functional test may consist of many instructions, each of which in turn consists of multiple clock periods. The transistor assumes different logic levels during various of these periods, according to the design of the microcircuit and the transistors' function in the circuit.

A functional test of typical microprocessor microcircuit 30 may consist of hundreds of instructions which together consist of perhaps 20,000 clock periods. During each of these individual clock periods, the transistor under test assumes one of two electrical states, ON or OFF. Determination is made of the state of the transistor under test during each clock period by making two measurements of device power supply current during each clock period; one with laser 12 off and one with laser 12 on. The difference between the two measurements indicates whether the electrical state of the particular transistor in microcircuit 30 is ON or OFF.

An OFF transistor will result in a large difference between the two measurements and an ON transistor will result in a very small difference. The concatenation of the result of this determination for all clock periods during the device test is referred to as the logic level sequence of the transistor under test.

The logic level sequence is measured in parts, each temporarily stored in a shift register and transferred to microcomputer 48 for storage and display. An example of a computer 48 and I/O boards which can be used with the present invention is the Intel MDS-220 microcomputer with National BLC-104 I/O board and National BLC-732 analog I/O board. An example of a typical software program which can be run with the above-mentioned microcomputer 48 is presented at the end of the specification and before the claims. When all the parts of the logic level sequence are measured, the complete logic level sequence is stored in microcomputer 48.

The timing margin measurement determined by the method of the present invention is then performed by functionally testing (with IC tester 34) microcircuit 30 a second time, using the same test vector set, but with the intensity of laser 12 gated by the previously measured and stored logic level sequence. Laser 12 is turned on only when the logic level sequence indicates that that the transistor under test will be OFF during the next clock period. When laser 12 is on and the transistor turns OFF, photogenerated carriers in the semiconductor are collected by the drain junction of the transistor under test as it becomes reverse biased and turns OFF. The effect of this collection of carriers is to slow down the logic level transition which is occurring on the circuit node because it opposes the action of other circuit elements in the device which are trying to switch the node voltage by supplying or sinking current to or from the node. The magnitude of the increase in switching time is related mathematically to transistor parameters (gain, threshold) and circuit parameters (node capacitance, current driving the node) and to the timing margin of the node, that is, how much time elapses between the time when switching is complete and the time when switching must be complete. If the transition time is increased to a point greater than that allowed by the design for proper operation, a logic level error will occur that will propagate through the device and cause the device to fail the functional test. It should also be noted that the intensity of laser 12 may be varied in order to establish different switching times.

Thus, this laser induced slowing of internal node switching time can be conveniently quantified because it can be measured externally as a change in certain overall device parameters such as minimum operating power supply voltage and maximum operating frequency. The higher the induced photocurrent, the more pronounced the effect. If the same level of photocurrent is used to test different transistors, a relative measure of the timing margins associated with those transistors may be obtained by determining the minimum power supply voltage or maximum operating frequency for which the integrated circuit operates correctly (no logic errors). Similarly, if the same level of power supply voltage is used to functionally test the integrated circuit with the beam applied to different transistors, a relative measure of the timing margins of those transistors may be obtained by determining the maximum level of photocurrent or maximum operating frequency for which the integrated circuit operates correctly (no logic errors). It is this relative ranking of timing margins associated with various transistors in microcircuit 30 which is of interest because it points to specific areas in the microcircuit 30 which should be redesigned to achieve higher performance (speed, temperature range, noise immunity).

It will be useful to compare patterns of timing margins among devices of the same and different circuit types and between different manufacturers in studying the "goodness" of designs. Another eventual goal to be achieved by use of the method of the present invention is to use this information to investigate the relationship between initial timing margin patterns (at fabrication) and long term reliability. Such an analysis could lead to an improved method of identifying and rejecting potentially unreliable devices (microcircuits).

Although this invention has been described with reference to a particular method, it will be understood that this invention is also capable of further and other variations within the spirit and scope of the appended claims. For example, it is possible within the scope of the present invention to illuminate by laser 12 the gate output which can encompass either a transistor, a gate or even possibly the entire integrated circuit. Furthermore, in some instances it may be desirable to keep laser 12 on continuously during the entire functional testing sequence, that is, not gated as determined by the transistor's logic state sequence.

PROGRAM LISTING

```
LIST
10 DEF INT A-Z
30 'ASSEMBLY ROUTINE JUMP ADDRESSES
40 START = #E00F: WRTNOD = #E052: STAGE = #E0AB: LGAN = #E0E0
50 SLOW = #E23E: FAST = #E273: RASTER = #E340:SER2 = #E3FD
60 COPY = #E15C:NWCPY = #E11A:CLFILE = #E092
65 IFTTST=#E1CD:OPTTST=#E179:WRTBIT=#E075
70 '
200 'BD=HEADER, B=BIT STREAM, N=NODE ARRAY, R=REFERENCE ARRAY
300 DIM BD(14),B(BI2),N(2,12),BDR(14),BR(BI2),NR(2,12)
400 '
500 'BI1=MAX ROW POSITION IN BIT ARRAY
600 BI2=2000:I2=100
```

```
800 '
900 'I1=LAST NODE POINTER, I=CURRENT NODE POINTER
1000 I1=0:I=0
1100 '
2600 'INITIALIZATION OF BAUD RATE SERIAL LINE 0 TO 300
2700 OUT 245,64:OUT 243,54
2800 OUT 240,64:OUT 240,00:OUT 245,207:OUT 245,37
2900 '
3000 'INITIALIZATION OF SERIAL LINE 1 BAUD RATE TO 1200
3100 OUT #F7,#40:OUT #F3,#76:OUT #F1,#10:OUT #F1,#00
3200 OUT #F7,#CF:OUT #F7,#25
3300 '
3400 'INITIALIZATION OF PORTS ,SCLK=0 , RESET X,Y DISPLAYS
3500 'RESET HARDWARE , INITIALIZE STAGE CONTROLS
3600 P9=#80        'P9=OUTPUT PORT 9 (1000 0000)
3700 FOR I=1 TO 7: READ X,Y: OUT X,Y:NEXT I
3800 DATA 7,#82,#B,#90,6,#1F,9,#18,9,#80,#A,#93,4,#FF
3900 'PORT 6 = 0001 1111 , PORT 9 = 0001 1000 THEN 1000 000
4000 'PORT A = 10010011 ,    PORT 4 = 0000 0000
4100 '
4200 ' INITIALIZATION OF A/D MUX CHANNEL,GAIN TO 1
4300 FOR I=1 TO 2 :READ X,Y:POKE X,Y:NEXT I
4400 DATA #DFF1,1,#DFF0,1
4500 '
4600 'CX=CURRENT X, CY=CURRENT Y, DY=DESTINATION Y, DX=DESTINATION X
4700 CX=0:CY=0:DX=0:DY=0
4850 '
4900 'DAC ADDRS
4950 DAC0=#DFF9:DAC1=#DFFB
5000 MIRSTP=1:MIRX=128:MIRY=128:IPHREF=190
5050 '
5100 'MOVE MIRRORS TO MIDDLE OF FIELD OF VIEW
5150 POKE DAC0,128:POKE DAC1,128
5200 '
5240 PRINT "MOVE TO CHIP COORDINATES 0000,0000 AND ZERO DISPLAY"
5260 PRINT " ========= APPROACH ZERO GOING CW,CW============="
5300 'COMMENT- NODE FILE EDITOR MAIN LOOP
5320 INPUT "ENTER DATE (MM,DD,YY) ";BD(1),BD(2),BD(3)
5400 IF I1=0 THEN PRINT "NODE BUFFER EMPTY"
5500 PRINT:PRINT "MIRROR POSITION : X,Y ";MIRX,MIRY
5800 PRINT "NOW WHAT? ";
5900 C$=""
6000 FOR A4 = 1 TO 10
6100 CH=GET
6200  IF CH=0 THEN GOTO 6100
6300 IF CH=13 THEN GOTO 7100
6400 IF CH=20 THEN MIRX=MIRX+MIRSTP:GOSUB 50000:GOTO 5400
6500 IF CH=31 THEN MIRX=MIRX-MIRSTP:GOSUB 50000:GOTO 5400
6600 IF CH=28 THEN MIRY=MIRY+MIRSTP:GOSUB 50000:GOTO 5400
6700 IF CH=30 THEN MIRY=MIRY-MIRSTP:GOSUB 50000:GOTO 5400
6800 PRINT CHR$(CH);
6900 C$=C$ + CHR$(CH)
7000 NEXT A4
7100 PRINT
7150 'STAGE COMMANDS
7200 IF LEFT$(C$,1)="G" THEN GOSUB 14000:GOTO 5400
7300 IF C$="RC" THEN GOSUB 13500:GOTO 5400
7350 IF C$="HB" THEN DX=0:DY=0:GOSUB 28800:GOTO 5400
7375 '
7380 'NODE FILE EDIT COMMANDS
7385 IF C$="SAVE" THEN GOSUB 18200:GOTO 5400
7390 IF C$="NEWN" THEN GOSUB 18900:GOTO 5400
7400 IF C$="A" THEN GOSUB 10600:GOTO 5400
7500 IF C$="I" THEN GOSUB 11200:GOTO 5400
7550 IF C$="D" THEN GOSUB 11900:GOTO 5400
7600 IF LEFT$(C$,1)="L" THEN GOSUB 15400:GOTO 5400
7700 IF C$="T" THEN I=1:GOSUB 14900:GOSUB 28800:GOTO 5400  'OPEN,POSITION
7800 IF C$="B" THEN I=I1:GOSUB 14900:GOSUB 28800:GOTO 5400 'OPEN,POSITION
8000 IF LEFT$(C$,2)="PN" THEN GOSUB 16200:GOTO 5400
8050 IF LEFT$(C$,2)="TN" THEN GOSUB 17500:GOTO 5400
8060 '
8070 'BIT STREAM DISPLAY COMMANDS
```

```
8080 IF C$="NEWB" THEN GOSUB 23700:GOTO 5400
8100 IF LEFT$(C$,2)="PB" THEN GOSUB 34500:GOTO 5400
8200 IF LEFT$(C$,3)="TB" THEN GOSUB 32200:GOTO 5400
8220 '
9150 'MIRROR CONTROL COMMANDS
9200 IF C$="S1" THEN MIRSTP=1:GOTO 5400
9300 IF C$="S10" THEN MIRSTP=10:GOTO 5400
9400 IF C$="S5" THEN MIRSTP=5:GOTO 5400
9500 IF LEFT$(C$,1)="M" THEN GOSUB 51000:GOTO 5400
9700 '
9800 'TEST MODE COMMANDS
9820 IF LEFT$(C$,2)="TM" THEN GOSUB 52000:GOTO 5400
9840 IF C$="3260"THEN OUT6,(#0A XOR #1E):DELAY0,1:OUT 6,(#0C XOR #1E):GOTO 5400
9860 IF C$="CDP"THEN OUT 6,(#0E XOR #1E):GOTO 5400
9880 IF C$="220" THEN OUT 6,(#00 XOR #1E):GOTO 5400
9900 IF C$="OPTTST" THEN GOSUB 36100:GOTO 5400
9920 IF C$ = "ANLOG" THEN GOSUB 30700:GOTO 5400
9940 IF LEFT$(C$,4)="TEST" THEN GOSUB 19900:GOTO 5400
9960 IF LEFT$(C$,4)= "COMP" THEN GOSUB 24300:GOTO 5400
10000 IF C$="IPTTST" THEN GOSUB 36700:GOTO 5400
10100 IF C$="STGTST" THEN GOSUB 54500:GOTO 5400
10120 '
10140 ' GENERAL COMMANDS
10200 IF C$="EXIT" THEN GOTO 52600
10220 IF C$="HELP" THEN GOSUB 50100:GOTO 5400
10240 IF C$="ON" THEN OUT 6,0:GOTO 5400
10260 IF C$="OFF" THEN OUT,6,255:GOTO 5400
10300 PRINT:PRINT C$ ;" NOT FOUND":PRINT
10400 GOTO 5400
10500 '
10600 'ADD NODE TO END OF FILE
10700 IF I1=I2 THEN PRINT "FILE FULL": GOTO 11000
10800 I=I1+1:I1=I1+1:GOSUB 29600:GOSUB 15000
10900 PRINT "ADDED         ";:GOSUB 15100
11000 RETURN
11100 '
11200 'INSERT NODE AT ITH INDEX
11300 IF I1=I2 THEN PRINT "FILE FULL":GOTO 11700
11400 FOR J=I1 TO I STEP -1
11500 N(0,J+1)=N(0,J):N(1,J+1)=N(1,J):NEXT J
11600 GOSUB 15000:I1=I1+1:PRINT "INSERTED        ";:GOSUB 15100
11700 RETURN
11800 '
11900 'DELETE THE ITH NODE
12000 IF I1=0 THEN PRINT "FILE EMPTY":GOTO 12600
12100 PRINT "DELETED        ",:GOSUB 15100
12200 IF I=I1 THEN I=I1-1:GOTO 12500
12300 FOR J=I+1 TO I1
12400 N(0,J-1)=N(0,J):N(1,J-1)=N(1,J):NEXT J
12500 I1=I1-1:IF I1=0 THEN N(0,1)=0:N(1,1)=0
12600 RETURN
12700 '
13100 PRINT "CURRENTLY      ";:GOSUB 15100
13200 PRINT "TYPE M WITH STAGE AT NEW NODE X,Y":M2=7
13300 RETURN
13400 '
13500 'RESET COUNTERS TO (0,0)
13600 OUT 9,#18:OUT 9,#80
13700 CX=0:CY=0:DX=0:DY=0
13800 RETURN
13900 '
14000 'MOVE STAGE TO ITH NODE OR ABSOLUTE X,Y
14100 IF MID$(C$,2,1) = "X" THEN GOTO 14500
14200 IF MID$(C$,2,1)= "Y" THEN GOTO 14600
14300 IF MID$(C$,2,1)<>"I" THEN RETURN
14400 I=VAL(MID$(C$,3)):GOSUB 14900:GOSUB 28800:RETURN
14500 C$=CHR$(35)+MID$(C$,3):DX = VAL(C$):GOSUB 28800:RETURN
14600 C$=CHR$(35)+MID$(C$,3):DY=VAL(C$):GOSUB 28800:RETURN
14700 '
14800 ' OPEN,CLOSE,POST
14900 MIRX=N(0,I):MIRY=N(1,I):CP=N(2,I):RETURN
15000 N(0,I)=MIRX:N(1,I)=MIRY:N(2,I)=0:RETURN
```

```
15100 PRINT "NODE #,MIRX,MIRY= ",I,MIRX,MIRY:RETURN
15200 PRINT "NODE #";I;"X=";N(0,I);"Y=";N(1,I):RETURN
15300 '
15400 ' MOVE NODE INDEX UP/DOWN
15500 IF LEN(C$)=1 THEN J=1:GOTO 15700
15600 A$=MID$(C$,2,LEN(C$)):J=VAL(A$)
15700 I=I+J
15800 IF I>I1 THEN I=I1
15900 IF I<1 THEN I=1
16000 GOSUB 14900:GOSUB 28800:RETURN
16100 '
16200 ' PRINT SOME NODES
16300 IF LEN(C$)=2 THEN J=1:GOTO 16900
16400 CHAR= INSTR(C$, "-")
16500 IF CHAR =0 THEN GOTO 16800
16600 K = VAL(MID$(C$,3,CHAR - 3))
16700 J = VAL(MID$(C$,CHAR +1,4)):IF J>I1 THEN J=I1: GOTO 17100
16800 J=VAL(MID$(C$,3,LEN(C$)))
16900 K=I
17000 J=J+K-1:IF J>I1 THEN J=I1
17100 FOR I=K TO J
17200 PRINT "             ";:GOSUB 15100:NEXT I
17300 I=K:RETURN
17400 '
17500 'TYPE SOME NODES
17600 POKE 3,64
17700 C$=MID$(C$,2,LEN(C$))
17800 GOSUB 16200
17900 POKE 3,65
18000 RETURN
18100 '
18200 'SAVE A NODE FILE TO DISK
18300 INPUT "NODE FILENAME ";F$:N(0,0)=4*(I1):N(1,0)=I1
18400 F$=F$ + " "
18500 CALL WRTNOD, F$,*N:CALL CLFILE
18600 PRINT "NODE FILE SAVED: ";F$
18700 RETURN
18800 '
18900 'RECOVER A FILE FROM DISK
19000 INPUT "NODE FILENAME ";F$:I3=4*(I2)
19100 F$=F$ + " "
19200 CALL START,F$,*N,I3:CALL CLFILE
19300 I1=N(1,0):I=1
19400 PRINT "NODE FILE RECOVERED: ";F$
19500 IF I1>I2 THEN PRINT "DISK FILE BIGGER THAN N ARRAY"
19600 IF I1=0 THEN PRINT "NEW FILE"
19700 RETURN
19800 '
20000 'TIMING NARGIN TEST
20020 INPUT "ENTER REFERENCE BIT STREAM FILE NAME,NODE #: ";C$,N1
20040 C$=C$+" "
20060 L=28:CALL OF ,C$:CALL RF,*BD,L:L=6*(BD(5)+1):CALL RF,*N,I
20080 L=3332 :FOR I=1 TO N1: CALL RF,+B,L:NEXT I:CALL CF
20100 INPUT "ENTER DUTSN,IPHI,IPHV:";BDR(0),BDR(1),BDR(2)
20120 OUT 6,(8 XOR #1E):L=6:CALL OPTTST,L,*BDR
20140 GOSUB 9360:IF CTS<>1 THEN GOTO 20140
20160 FOR P=1 TO 13 :CALL PTSR,P,B,B(1)
20180 OUT 7,#0B:OUT 7,8:GOSUB 9360:IF CTS<>0 THEN GOTO 20180
20200 OUT 7,9:GOSUB 9360:IF CTS<>1 THEN GOTO 20200
20220 GOSUB 9340 :IF TST=0 THEN GOTO 2950
20240 NEXT P
20260 GOSUB 9360:IF CTS<>0 THEN GOTO 20260
20280 OUT 7,8:GOSUB 9360 :IF CTS <>1 THEN 20280
20300 OUT 7,9:GOSUB 9320 :IF PASS<>1 THEN 20140
20320 OUT 6,(#00 XOR #1E):OUT 7,8
20340 PRINT "VDDMIN FOUND"
20360 OUT 7,#0A:RETURN
22700 '
22800 'GET ARRAY BD FOR BOOK KEEPING DATA
22900 PRINT "LOAD OUTPUT DISK, THEN HIT ANY KEY TO CONTINUE."
23000 INPUT B$
23100 INPUT "ENTER DATE IN FORM MM,DD,YY.";BD(1),BD(2),BD(3)
```

```
23200 INPUT "ENTER PART NUMBER ";BD(4)
23300 INPUT "ENTER TEST FILE NAME";B$:B$=B$ + " "
23400 FOR A=1 TO 6:BD(6+A)=ASC(MID$(B$,A,1)):NEXT A
23500 BD(0)=26:CALL NWCPY,B$,*BD,*N :RETURN
23600 '
23700 'RECOVER BIT STREAM ARRAY FROM DISK
23800 INPUT "ENTER NAME OF BIT STREAM TO BE RECOVERED   ";B$:B3=2*C2
23900 B$=B$+" "
24000 CALL START,B$,*B,B3
24100 RETURN
24200 '
24300 'COMPARE BIT ARRAYS
24400 E=0
24500 INPUT "BIT STREAM FILE TO BE COMPARED ";B$:B3=2*C2
24600 B$=B$+" "
24700 CALL START,B$,*B,B3
24800 INPUT "NAME OF REFERENCE BIT STREAM FILE ";R$:BR3=2*C2
24900 R$=R$+" "
25000 CALL START, R$, *V, BR3
25100 IF V(0)<>B(0) THEN PRINT "BIT FILES NOT THE SAME":GOTO 5400
25200 IF V(1001)<>B(1001) THEN PRINT "DIFFERENT # OF NODES.":GOTO 5400
25300 FOR L=1 TO B(0)/4
25400 P=B(L) XOR V(L)
25500 IF P<>0 THEN GOSUB 27900
25600 NEXT L
25700 '
25800 'SAVE COMPARE FILE
25900 PRINT
26000 IF E=0 THEN PRINT "NO MISCOMPARES FOUND. " :GOTO 27700
26100 PRINT "COMPARE COMPLETED.  SAVE COMPARE FILE."
26200 INPUT "COMPARE FILENAME ";C$:N(0,0)=4*E:N(1,0)=E
26300 C$=C$+" "
26400 CALL QUIT,*N,C$
26500 PRINT "COMPARE FILE SAVED: ";C$
26600 PRINT
26700 PRINT "MISCOMPARES: "
26800 PRINT
26900 FOR L=1 TO E
27000 PRINT "ROW NUMBER:   ";N(0,L)
27100 FOR J=15 TO 1 STEP -1
27200 PRINT TEST (N(1,L),J);
27300 NEXT J
27400 PRINT TEST(N(1,L),0)
27500 NEXT L
27600 PRINT
27700 RETURN
27800 '
27900 'MAKE COMPARE FILE
28000 E=E+1
28100 IF E>1000 THEN PRINT "COMPARE FILE IS FULL"
28200 'N(0,E)=ROW OF MISCOMPARE
28300 'N(1,E)=COLUMN  OF MISCOMPARE
28400 N(0,E)=L
28500 N(1,E)=P
28600 RETURN
28700 '
28800 ' MOVE THE STAGE TO X,Y
28900 GOSUB 29600: I6=DX-CX:I7=DY-CY:IF I6+I7=0 THEN GOTO 29400
29000 OUT #B,7: IF I6<0 THEN OUT #B,6    'CW OR CCW X STAGE
29100 OUT #B,#D:IF I7<0 THEN OUT #B,#C   'CW OR CCW Y STAGE
29200 I6=ABS(I6):I7=ABS(I7):SCALL STAGE,I6,I7    'CALL TO MOVE STAGE
29300 GOTO 28900
29400 RETURN
29500 '
29600 'GET X AND Y
29700 DELAY 0,0,5
29800 IB=0:P9=(P9 AND #F8):GOSUB 30100:CX=IB
29900 IB=0:P9=P9+4:GOSUB 30100: CY=IB
30000 RETURN
30100 FOR IA=3 TO 0 STEP -1:OUT 9,(P9+IA):IB=LSHIFT(IB,4)OR(IN(5)AND#0F)
30200 NEXT IA
30300 RETURN
```

```
30400 '
33900 '
34000 'TYPE BIT STREAM
34100 POKE 3,64
34200 OUT 6,#09:GOSUB 23800:
34300 POKE 3,65
34400 RETURN
34500 'PRINT BIT STREAM TO CO
34600 IF LEN(C$)=2 THEN JJ=1: GOTO 35100
34700 CHAR=INSTR(C$,"-"): IF CHAR = 0 THEN GOTO 35000
34800 KK=VAL(MID$(C$,3,CHAR-3)):JJ=VAL(MID$(C$,CHAR+1,4))
34900 GOTO 35200
35000 JJ=VAL(MID$(C$,3,LEN(C$)))
35100 KK=1: JJ=JJ+KK-1: IF JJ>BI1 THEN JJ=BI1
35200 PRINT " BIT   15 14 13 12 11 10  9  8  7  6  5  4  3  2  1  0"
35300 PRINT
35400 FOR BI=KK TO JJ
35500 PRINT BI;"    ";
35600 FOR C=15 TO 0 STEP -1
35700 PRINT TEST(B(BI),C);
35800 NEXT C  PRINT: NEXT BI
35900 RETURN
36000 '
36100 'SEND FILE TO 3260 VIA PORT 4 , BLC 104
36200 INPUT "ENTER FILENAME   ";B$:B$=B$ + " "
36300 I3=4*I2
36400 CALL OPTTST ,B$,*N, I3            'OUTPUT FILE TO TESTER VIA PORT 4
36500 RETURN
36600 '
36700 'INPUT FILE FROM 3260
36800 INPUT "INPUT FILE NAME  ";B$:B$=B$ + " "
36900 CALL IPTTST, *B                   'INPUT FILE FROM TESTER
37000 RETURN
37100 '
37200 'MIRROR SCAN SUBROUTINE
37300 POKE DAC1,#YP:FOR YSCAN = YP TO YP2 STEP 16
37400 FOR XSCAN= XP TO XP2 STEP 16
37500 POKE DAC0,#XSCAN:NEXT XSCAN
37600 POKE DAC1,#YSCAN:NEXT YSCAN
37700 '
37800 'POSITION MIRRORS
37900 B$=MID$(C$,2,1):C=VAL(MID$(C$,3,LEN(C$)))
38000 IF B$="X" THEN MIRX=C:GOSUB 40000:GOTO 38300
38100 IF B$="Y" THEN MIRY=C:GOSUB 40000:GOTO 38300
38200 IF B$="I" THEN I=C:GOSUB 14800:GOSUB 40000
38300 RETURN
39000 '
40000 'MOVE MIRRORS
40100 IF MIRX>255 THEN MIRX=255
40200 IF MIRX<0 THEN MIRX=0
40300 IF MIRY>255 THEN MIRY=255
40400 IF MIRY<0 THEN MIRY=0
40500 POKE DAC0,MIRX:POKE DAC1,MIRY:RETURN
40600 '
50000 IF GET="0" THEN 37300
50100 'HELP LISTING FOR NODFIL
50200 PRINT "A = ADD NODE TO END OF FILE",
50300 PRINT "     I = INSERT NODE AT CURRENT CURSOR POSITION":PRINT
50400 PRINT "T = GOTO TOP OF NODE FILE",
50500 PRINT "    B = GO TO BOTTOM OF NODE FILE":PRINT
50600 PRINT "L(X) = MOVE NODE INDEX",
50700 PRINT "    M(X) = MOVE NODE TO NEW X,Y ":PRINT
50800 PRINT "P = PRINT NODES",
50900 PRINT "    TY = TYPE NODES":PRINT
51000 PRINT "SAVE = SAVE NODE FILE",
51100 PRINT "     BEGIN = READ IN NODE FILE":PRINT
51200 PRINT "D = DELETE NODE",
51300 PRINT "     RC = RESET COUNTERS":PRINT
51400 PRINT
51500 PRINT "G = MOVE STAGE TO NEW X,Y";
51600 PRINT "         HY = MOVE Y STAGE HOME":PRINT
51700 PRINT "HX = MOVE X STAGE HOME",
```

```
51800 PRINT "       HB - MOVE BOTH STAGES HOME":PRINT
51900 PRINT "UP ARROW - MOVE Y STAGE CW";
52000 PRINT "       DOWN ARROW - MOVE Y STAGE CCW":PRINT
52100 PRINT "LEFT ARROW = MOVE X STAGE CW";
52200 PRINT "       RIGHT ARROW - MOVE X STAGE CCW":PRINT
52300 PRINT "EXIT - EXIT FROM PROGRAM TO BASIC"
52400 PRINT
52500 INPUT "ENTER ANY KEY TO CONTINUE "O$:RETURN
52600 'EXIT FROM PROGRAM TO BASIC
52700 PRINT "  PROGRAM EXECUTION COMPLETE.  RETURN IS TO BASIC."
52800 END
52900 OUT 4,#FF:OUT 6,#00:PRINT "":DELAY 0,5,0
53000 OUT 4,#00:OUT 6,#FF:PRINT "":DELAY 0,5,0
53100 MSK=1 FOR I=0 TO 7:OUT 4,MSK:PRINT "":DELAY 0.5,0:MSK=MSK*2:NEXT I
53200 OUT 4,#00
53300 MSK=#FD:FOR I=1 TO 4:OUT 6,MSK:PRINT "":DELAY 0,5,0
53400 MSK=LSHIFT(MSK,1):MSK=RESET(MSK,8):MSK=SET(MSK,0):NEXT I
53500 GOTO 52900
53600 '
53700 POKE #DFF1,2:GOSUB 54000:PASS=II:RETURN
53800 POKE #DFF1,3:GOSUB 54000:TST=II:RETURN
53900 POKE #DFF1,4:GOSUB 54000:CST=II:RETURN
54000 POKE #DFF0,#01
54100 I=PEEK(#DFF0):I=TEST(I,7):IF I<>1 THEN 54100
54200 I=PEEK(#DFF5):IF I<#40 THEN II=1 :GOTO 54400
54300 II=0
54400 RETURN
54500 GOSUB 18900
54600 FOR TTT=1 TO 10
54700 FOR =1 TO I1:DX=N(0,T):DY=N(1,T):GOSUB 28800
54800 PRINT "TESTING NODE ";T;" X=";HEX$(CX);"     Y=";HEX$(CY)
54900 DELAY 0,1:NEXT T
55000 DELAY 0,2:NEXT TTT:RETURN

OK
                    ASM80 LASER2.SRC

ISIS-II 8080/8085 MACRO ASSEMBLER, V3.0        LASER2   PAGE   1

LOC   OBJ         LINE      SOURCE STATEMENT

1  NAME LASER2
                    2  PUBLIC OF,RF,WF,CF
                    3  PUBLIC LASER2,STAGE,LOGAN,D20MS
                    4  PUBLIC OPTTST,DISSAV,IPTTST,LINESC
                    5  EXTRN ISIS,ACON
                    6  ;************************************************
                    7  ;CONSTANTS
DFF8                8  DAC0   EQU  0DFF8H
DFFA                9  DAC1   EQU  0DFFAH
3283               10  GTPAR  EQU  3283H
0000               11  OPEN   EQU  0
0004               12  WRITE  EQU  4
0003               13  READ   EQU  3
0001               14  CLOSE  EQU  1
0006               15  LOAD   EQU  6
000C               16  ERROR  EQU  12
000E               17  CTSPRT EQU  0EH
0004               18  CTSMSK EQU  04H
                   19  ;************************************************
                   20         CSEG
0000  112C00    D  21  LASER2: LXI  D,LBLK    ;LOAD XYBAS AND PASS CONTROL
0003  0E06         22         MVI  C,LOAD
0005  CD0000    E  23         CALL ISIS
0008  3A4800    D  24         LDA  STATUS
000B  B7           25         ORA  A
000C  C28600    C  26         JNZ  ERR
                   27  ;************************************************
                   28  ;OPEN DISK FILE
```

```
000F CD8332       29 OF:    CALL GTPAR      ;SET UP OPEN BLOCK
0012 23           30        INX H           ;GET PAST LENGTH OF STRING
0013 5E           31        MOV E,M
0014 23           32        INX H
0015 56           33        MOV D,M
0016 EB           34        XCHG
0017 220200   D   35        SHLD FNPTR
001A 110000   D   36        LXI D,OBLK
001D 0E00         37        MVI C,OPEN
001F CD0000   E   38        CALL ISIS
0022 3A4800   D   39        LDA STATUS
0025 B7           40        ORA A
0026 C28600   C   41        JNZ ERR
0029 2A0A00   D   42        LHLD RAFTN
002C 221400   D   43        SHLD WAFTN
002F 221C00   D   44        SHLD SAFTN
0032 223600   D   45        SHLD CAFTN
0035 C9           46        RET
                  47 ;**********************************************************
                  48 ;READ DISK FILE
0036 CD8332       49 RF:    CALL GTPAR      ;READ ADDRESS
0039 220C00   D   50        SHLD RPTR
003C CD8332       51        CALL GTPAR      ;SET READ LENGTH
003F 5E           52        MOV E,M
0040 23           53        INX H
0041 56           54        MOV D,M
0042 EB           55        XCHG
0043 220E00   D   56        SHLD RL
0046 110A00   D   57        LXI D,RDBLK     ;READ IN FILE
0049 0E03         58        MVI C,READ
004B CD0000   E   59        CALL ISIS
004E 3A4800   D   60        LDA STATUS
0051 B7           61        ORA A
0052 C28600   C   62        JNZ ERR
0055 C9           63        RET
                  64 ;**********************************************************
                  65 ;WRITE TO DISK FILE
0056 CD8332       66 WF:    CALL GTPAR      ;GET WRITE POINTER
0059 221600   D   67        SHLD WPTR
005C CD8332       68        CALL GTPAR      ;GET WRITE LENGTH
005F 5E           69        MOV E,M
0060 23           70        INX H
0061 56           71        MOV D,M
0062 EB           72        XCHG
0063 221800   D   73        SHLD WLN        ;GET WRITE LENGTH
0066 111400   D   74 WFASM: LXI D,WBLK
0069 0E04         75        MVI C,WRITE     ;WRITE FILE TO DISK
006B CD0000   E   76        CALL ISIS
006E 3A4800   D   77        LDA STATUS
0071 B7           78        ORA A
0072 C28600   C   79        JNZ ERR
0075 C9           80        RET
                  81 ;**********************************************************
                  82 ;CLOSE DISK FILE
0076 113600   D   83 CF:    LXI D,CBLK      ;CLOSE FILE
0079 0E01         84        MVI C,CLOSE
007B CD0000   E   85        CALL ISIS
007E 3A4800   D   86        LDA STATUS
0081 B7           87        ORA A
0082 C28600   C   88        JNZ ERR
0085 C9           89        RET
                  90 ;**********************************************************
                  91 ;ERROR SUBROUTINE
0086 113A00   D   92 ERR:   LXI D,EBLK
0089 0E0C         93        MVI C,ERROR
008B CD0000   E   94        CALL ISIS
008E C9           95        RET
                  96 ;**********************************************************
                  97 ;                    MOVE X AND Y STAGES
                  98 ;
008F 79           99 STAGE: MOV A,C         ;CHECK IF X=0
0090 B0          100        ORA B
```

```
0091 CAAA00   C   101            JZ YCLK
0094 3E05         102            MVI A,05H          ;MOVE X STAGE
0096 D30B         103            OUT 0BH            ;SET X CLOCK
0098 3E04         104            MVI A,04H          ;RESET X CLOCK
009A D30B         105            OUT 0BH
009C 3E32         106            MVI A,32H          ;TIMING LOOP
009E 7F           107 XLOOP:     MOV A,A
009F 3D           108            DCR A
00A0 B7           109            ORA A
00A1 C29E00   C   110            JNZ XLOOP
00A4 0B           111            DCX B
00A5 79           112            MOV A,C
00A6 B0           113            ORA B
00A7 C28F00   C   114            JNZ STAGE
00AA 7B           115 YCLK:      MOV A,E            ;CHECK IF Y=0
00AB B2           116            ORA D
00AC C8           117            RZ
00AD 3E0B         118            MVI A,0BH          ;MOVE Y STAGE
00AF D30B         119            OUT 0BH
00B1 3E0A         120            MVI A,0AH
00B3 D30B         121            OUT 0BH
00B5 3E32         122            MVI A,32H          ;TIMING LOOP
00B7 7F           123 YLOOP:     MOV A,A
00B8 3D           124            DCR A
00B9 B7           125            ORA A
00BA C2B700   C   126            JNZ YLOOP
00BD 1B           127            DCX D
00BE 7B           128            MOV A,E
00BF B2           129            ORA D
00C0 C2AA00   C   130            JNZ YCLK
00C3 C9           131            RET
                  132 ;:::::::::::::::::::::::::::::::::::::::::::::::
                  133 ;    OUTPUT BIT STREAMS TO LOGIC ANALYZER
                  134 ;    CALL FROM NODFIL (TO LOGAN)
                  135 ;    OUTPUT THROUGH PORT 8                  output B0-7
                  136 ;
00C4 CD8332       137 LOGAN:     CALL GTPAR         ;GET VALUE OF S. IF S=0 THEN OUP
00C7 46           138            MOV B,M            ;IF S=1 THEN OJTPUT B8-B15
00C8 C5           139            PUSH B
00C9 CD8332       140            CALL GTPAR         ;GET BIT STREAM ADDRESS
00CC 23           141            INX H
00CD 23           142            INX H
00CE C1           143            POP B
00CF 7D           144            MOV A,L
00D0 80           145            ADD B
00D1 6F           146            MOV L,A
00D2 110104       147            LXI D,1025D
00D5 CDF500   C   148            CALL CLK           ;TRIGGER LOGIC ANALYZER
00D8 3E01         149            MVI A,01H
00DA D304         150            OUT 04H
00DC CDF500   C   151            CALL CLK
00DF 3E00         152            MVI A,00H
00E1 D304         153            OUT 04H
00E3 CDF500   C   154            CALL CLK
00E6 7E           155 LA:        MOV A,M
00E7 D304         156            OUT 04H            ;OUTPUT ROW OF BIT STREAM ARRAY
00E9 CDF500   C   157            CALL CLK
00EC 1B           158            DCX D              ;DECREMENT BIT STREAM LENGTH
00ED 23           159            INX H
00EE 23           160            INX H
00EF 7A           161            MOV A,D
00F0 B3           162            ORA E
00F1 C2E600   C   163            JNZ LA             ;CHECK TO SEE IF ALL BITS HAVE B
00F4 C9           164            RET
                  165 ;:::::::::::::::::::::::::::::::::::::::::::::::
                  166 ;CLOCK THE LOGIC ANALYZER
00F5 3E01         167 CLK:       MVI A,01H          ;STROBE CLOCK
00F7 D307         168            OUT 07H            ;OUT PORT 7 BIT 0
00F9 3E00         169            MVI A,00H
00FB D307         170            OUT 07H
00FD C9           171            RET
                  172 ;***********************************************
```

```
00FE CD8332            173 OPTTST:  CALL GTPAR      ;GET LENGTH
0101 5E                174          MOV E,M
0102 23                175          INX H
0103 56                176          MOV D,M
0104 D5                177          PUSH D
0105 CD8332            178          CALL GTPAR      ;GET ADR
0108 D1                179          POP D           ;HERE HL=ADR DE=LENGTH
0109 DB0E              180 INCTS:   IN CTSPRT       ;LOOP ON CTS=0
010B E604              181          ANI CTSMSK
010D B7                182          ORA A
010E CA0901  C         183          JZ INCTS
0111 7E                184 DATOUT:  MOV A,M
0112 D304              185          OUT 04H         ;OUTPUT DATA TO PORT 4
0114 3E08              186          MVI A,08H       ;SET SENT BIT ( NV P6)
0116 D307              187          OUT 07H
0118 DB0E              188 GETCTS:  IN CTSPRT       ;GET CTS FROM 3 60
011A E604              189          ANI CTSMSK      ;MASK OFF CTS B T PORT 8
011C B7                190          ORA A
011D C21801  C         191          JNZ GETCTS      ;LOOP ON CTS=1
0120 3E09              192          MVI A,09H       ;SENT=0
0122 D307              193          OUT 07H
0124 1B                194          DCX D
0125 23                195          INX H
0126 7B                196          MOV A,E
0127 B2                197          ORA D
0128 C20901  C         198          JNZ INCTS
012B C9                199          RET
                       200 ;************************************************
                       201 IPTTST:                  ;INPUT FILE FROM 3260
                       202 ;************************************************
012C CD8332            203 DISSAV:  CALL GTPAR      ;GREYSCALE ADR TO TBL
012F 7E                204          MOV A,M
0130 FE01              205          CPI 01H
0132 215600  D         206          LXI H,TBL1
0135 CA4301  C         207          JZ PASS
0138 FE02              208          CPI 02H
013A 215600  D         209          LXI H,TBL2
013D CA4301  C         210          JZ PASS
0140 215600  D         211          LXI H,TBL3
0143 224A00  D         212 PASS:    SHLD TBL
                       213 ;************************************************
0146 CD8332            214          CALL GTPAR      ;SET MUXGAIN REG
0149 7E                215          MOV A,M
014A 32F1DF            216          STA 0DFF1H
                       217 ;************************************************
014D 2100FF            218          LXI H,0FF00H    ;YPOS TO STACK
0150 E5                219          PUSH H
0151 110000            220          LXI D,0000H     ;XPOS TO D
0154 010001            221          LXI B,0100H     ;# INCREMENT FOR XPOS
0157 EB                222 LOOP:    XCHG            ;H=XPOS D= DONT CARE
0158 22F8DF            223          SHLD DAC0
015B EB                224          XCHG
015C E1                225          POP H
015D 22FADF            226          SHLD DAC1
0160 E5                227          PUSH H
0161 7A                228          MOV A,D         ;IF X=00 THEN DELAY FOR RETRACE
0162 B7                229          ORA A
0163 C26901  C         230          JNZ DSVC1
0166 CDAC01  C         231          CALL D20MS
0169 3E01              232 DSVC1:   MVI A,01H       ;SAMPLE A PIXEL
016B 32F0DF            233          STA 0DFF0H
016E 3AF0DF            234 FINCO:   LDA 0DFF0H
0171 07                235          RLC
0172 D26E01  C         236          JNC FINCO
0175 3AF5DF            237          LDA 0DFF5H      ;GET THE NEW PIXEL
0178 C600              238          ADI 00H
017A E6E0              239          ANI 0E0H
017C 6F                240          MOV L,A
017D 0F                241          RRC
017E 0F                242          RRC
017F 0F                243          RRC
0180 E61C              244          ANI 1CH
```

```
0182 E5              245            ORA L
0183 324C00   D      246            STA PMT1
0185 EB              247            XCHG                ;X=X+1, MOVE X MIRROR NOW  TRANSI
0187 09              248            DAD B               ;THIS SHOULD GIVE 4MS DELAY FOR;
0188 22F8DF          249            SHLD DAC0
018B EB              250            XCHG
019C D5              251            PUSH D              ;TO 3260
018D 110100          252            LXI D,0001H
0190 214C00   D      253            LXI H,PMT1
0193 CD0901   C      254            CALL INCTS
0196 D1              255            POP D
0197 7A              256            MOV A,D             ;EOL IF 00 HERE
0198 FE00            257            CPI 00H
019A C25701   C      258            JNZ LOOP
019D E1              259            POP H               ;DECR YPOS
019E 7D              260            MOV A,L
019F 91              261            SUB C
01A0 6F              262            MOV L,A
01A1 7C              263            MOV A,H
01A2 98              264            SBB E
01A3 67              265            MOV H,A
01A4 E5              266            PUSH H
01A5 FEFF            267            CPI 0FFH            ;EOF IF FF
01A7 C25701   C      268            JNZ LOOP
01AA E1              269  DONE:     POP H                ;HA'
01AE C9              270            RET
                     271  ;************************************************
01AC F5              272  D20MS:    PUSH PSW             ;WAIT 20 MILLISEC FOR RETRACE
01AD E5              273            PUSH H
01AE 21A505          274            LXI H,1445D
01B1 2B              275  D20LP1:   DCX H
01B2 7C              276            MOV A,H
01B3 B5              277            ORA L
01B4 C2B101   C      278            JNZ D20LP1
01B7 E1              279            POP H
01B8 F1              280            POP PSW
01B9 C9              281            RET
                     282  ;**********************************************************
                     283  ;LINE SCAN FROM SCANNER TO 3260 DIRECTLY
01BA CD8332          284  LINESC:   CALL GTPAR           ;MX TO DAC0
01BD 7E              285            MOV A,M
01BE 67              286            MOV H,A
01BF 2E00            287            MVI L,00H
01C1 22F8DF          288            SHLD DAC0
01C4 CD8332          289            CALL GTPAR           ;MY TO DAC1
01C7 7E              290            MOV A,M
01C8 67              291            MOV H,A              ;POSITION Y MIRROR
01C9 2E00            292            MVI L,00H
01CB 22FADF          293            SHLD DAC1
01CE CD8332          294            CALL GTPAR           ;SET A/D CHANNEL TO 1=REFL LIGHT
01D1 7E              295            MOV A,M
01D2 32F1DF          296            STA 0DFF1H
01D5 CD8332          297            CALL GTPAR           ;X OR Y SCAN (READ 1 OR 0)
01D8 7E              298            MOV A,M
01D9 B7              299            ORA A
01DA C20702   C      300            JNZ YLSC
01DD 0600            301  XLSC:     MVI B,00H            ;INITIALIZE COUNTER
01DF 60              302  XLP1:     MOV H,B              ;POSITION X MIRROR
01E0 2E00            303            MVI L,00H
01E2 22F8DF          304            SHLD DAC0
01E5 3E01            305            MVI A,01H            ;GET A PIXEL
01E7 32F0DF          306            STA 0DFF0H
01EA 3AF0DF          307  XLP2:     LDA 0DFF0H
01ED 07              308            RLC
01EE D2EA01   C      309            JNC XLP2
01F1 3AF5DF          310            LDA 0DFF5H
01F4 324C00   D      311            STA PMT1             ;SETUP FOR OPTTST
01F7 214C00   D      312            LXI H,PMT1
01FA 110100          313            LXI D,0001H
01FD CD0901   C      314            CALL INCTS           ;THIS DOES TRANSFER TO 3260
0200 04              315            INR B                ;NEXT MX, DONE IF 00 AGAIN
0201 78              316            MOV A,B
```

```
0202 B7              317          ORA  A
0203 C2DF01    C     318          JNZ  XLP1
0206 C9              319          RET
                     320 ;*********************************************************
0207 0600            321 YLSC:    MVI  B,00H         ;FIRST PIXEL Y
0209 60              322 YLP1:    MOV  H,E           ;SEE ABOVE FOR COMMENTS
020A 2E00            323          MVI  L,00H
020C 22FADF          324          SHLD DAC1
020F 3E01            325          MVI  A,01H
0211 32F0DF          326          STA  0DFF0H
0214 3AF0DF          327 YLP2:    LDA  0DFF0H
0217 07              328          RLC
0218 D21402    C     329          JNC  YLP2
021B 3AF5DF          330          LDA  0DFF5H
021E 324C00    D     331          STA  PMT1
0221 214C00    D     332          LXI  H,PMT1
0224 110100          333          LXI  D,0001H
0227 CD0901    C     334          CALL INCTS
022A 04              335          INR  B
022B 78              336          MOV  A,B
022C B7              337          ORA  A
022D C20902    C     338          JNZ  YLP1
0230 C9              339          RET
                     340 ;*********************************************************
                     341          DSEG
                     342 ;:::::::::::::::::::::::::::::::::::::::::::::::::::::::::
                     343 OBLK:
0000 0A00      D     344 OAFTN:   DW   RAFTN
0002                 345 FNPTR:   DS   2
0004 0300            346          DW   3
0006 0000            347          DW   0
0008 4800      D     348          DW   STATUS
                     349 ;*********************************************************
                     350 RDBLK:
000A                 351 RAFTN:   DS   2
000C                 352 RPTR:    DS   2
000E                 353 RL:      DS   2
0010 4600      D     354          DW   ACTUAL
0012 4800      D     355          DW   STATUS
                     356 ;*********************************************************
                     357 WBLK:
0014                 358 WAFTN:   DS   2
0016                 359 WPTR:    DS   2           ;FROM ADDRESS OF N(0,0)
0018                 360 WLN:     DS   2           ;FROM I3
001A 4800      D     361          DW   STATUS
                     362 ;*********************************************************
                     363 SBLK:
001C                 364 SAFTN:   DS   2
001E                 365 MODE:    DS   2
0020 2800      D     366          DW   BLKS
0022 2600      D     367          DW   NBYTE
0024 4800      D     368          DW   STATUS
                     369 ;*********************************************************
0026                 370 NBYTE:   DS   2
0028                 371 BLKS:    DS   2
002A                 372 LAST:    DS   2
                     373 ;*********************************************************
                     374 LBLK:
002C 3E00      D     375          DW   FILNAM
002E 0000            376          DW   0
0030 0100            377          DW   1
0032 4400      D     378          DW   ENAD
0034 4800      D     379          DW   STATUS
                     380 ;:::::::::::::::::::::::::::::::::::::::::::::::::::::::::
                     381 CBLK:
0036                 382 CAFTN:   DS   2
0038 4800      D     383          DW   STATUS
                     384 ;*********************************************************
003A                 385 EBLK:    DS   2
003C 4800      D     386          DW   STATUS
                     387 ;*********************************************************
003E 58594241        388 FILNAM:  DB   'XYBAS '
```

```
0042 5320
0044              389 ENAD:    DS 2
0046              390 ACTUAL:  DS 2
0048              391 STATUS:  DS 2
                  392 ;*********************************:*****************
004A              393 TBL:     DS 2         ;GREYSCALE USED NOW
004C              394 PMT1:    DS 2         ;BUFFER POINTER
004E              395 PMTLN:   DS 2         ;BUFFER LENGTH (8 BIT WDS)
0050              396 PMTAD:   DS 2         ;BUFFER START ADR
0052              397 COUNT:   DS 2         ;PIXEL COUNT
0054              398 HOLD:    DS 1
0055              399 HOLD2:   DS 1
                  400 TBL2:
                  401 TBL3:
0056 00           402 TBL1:    DB 00H,10H,20H,30H,40H,50H,60H,70H
0057 10
0058 20
0059 30
005A 40
005B 50
005C 60
005D 70
005E 80           403          DB 80H,90H,0A0H,0B0H,0C0H,0D0H,0E0H,0F0H
005F 90
0060 A0
0061 B0
0062 C0
0063 D0
0064 E0
0065 F0
                  404 ;*****************************************************
0000          C   405 END LASER2
```

PUBLIC SYMBOLS
| | | | | | | | | | |
|---|---|---|---|---|---|---|---|---|---|
| CF | C 0076 | D20MS | C 01AC | DISSAV | C 012C | IPTTST | C 012C | LASER2 | C 000 |
| OF | C 000F | OPTTST | C 00FE | RF | C 0036 | STAGE | C 008F | WF | C 005 |

EXTERNAL SYMBOLS
ACON    E 0000    ISIS    E 0000

USER SYMBOLS
| | | | | | | | | | |
|---|---|---|---|---|---|---|---|---|---|
| ACON | E 0000 | ACTUAL | D 0046 | BLKS | D 0028 | CAFTN | D 0036 | CBLK | D 003 |
| CLOSE | A 0001 | COUNT | D 0052 | CTSMSK | A 0004 | CTSPRT | A 000E | D20LP1 | C 01B |
| AC1 | A DFFA | DATOUT | C 0111 | DISSAV | C 012C | DONE | C 01AA | DSVC1 | C 016 |
| ERR | C 0086 | ERROR | A 000C | FILNAM | D 003E | FINCO | C 016E | FMPTR | D 000 |
| HOLD | D 0054 | HOLD2 | D 0055 | INCTS | C 0109 | IPTTST | C 012C | ISIS | E 000 |
| LAST | D 002A | LBLK | D 002C | LINESC | C 01BA | LOAD | A 0005 | LOGAN | C 00C |
| NBYTE | D 0026 | OAFTN | D 0000 | OBLK | D 0000 | OF | C 000F | OPEN | A 000 |
| PMT1 | D 004C | PMTAD | D 0050 | PMTLN | D 004E | RAFTN | D 000A | RDBLK | D 000 |
| RL | D 000E | RPTR | D 000C | SAFTN | D 001C | SBLK | D 001C | STAGE | C 008 |

```
                   1
                   2 NAME STRM3
                   3 PUBLIC FAST,ACON,PTSR
                   4 ;*****************************     ;****************
                   5 ;CONSTANTS
0007               6        CNTL    EQU 07H
0009               7        SMC     EQU 09H
0008               8        RMC     EQU 08H
0007               9        PRTCLK  EQU 07H
0009              10        PRTOUT  EQU 09H
0001              11        SSCLK   EQU 01H
0000              12        RSCLK   EQU 00H
0010              13        QSRMSK  EQU 10H
0005              14        FORTIN  EQU 05H
3283              15        GETPAR  EQU 3283H
DFF1              16        MUXGN   EQU 0DFF1H
DFF5              17        AD      EQU 0DFF5H
DFF0              18        ADCR    EQU 0DFF0H
                  19 ;*****************************************************
                  20 CSEG
0000 CD8332       21 STRM3:  CALL GETPAR
```

```
0003 220300      D   22             SHLD  STRTBL
0006 CD8332          23             CALL  GETPAR
0009 7E              24             MOV   A,M
000A B7              25             ORA   A
000B CA1500      C   26             JZ    LOWER
000E 2A0300      D   27             LHLD  STRTBL
0011 23              28             INX   H
0012 220300      D   29             SHLD  STRTBL
0015 CD8332          30  LOWER:     CALL  GETPAR
0018 7E              31             MOV   A,M
0019 320700      D   32             STA   BITMSK
001C CD8332          33             CALL  GETPAR
001F 5E              34             MOV   E,M
0020 23              35             INX   H
0021 56              36             MOV   D,M
0022 EB              37             XCHG
0023 220000      D   38             SHLD  EDGNUM
0026 C9              39             RET
                     40  ;**********************************************************
                     41  ;GATHER A FAST BIT STREAM
0027 CD8332          42  FAST:      CALL  GETPAR
002A 220300      D   43             SHLD  STRTBL
002D CD8332          44             CALL  GETPAR
0030 7E              45             MOV   A,M
0031 320200      D   46             STA   MODE
0034 3E1B            47             MVI   A,1BH
0036 D306            48             OUT   06H
0038 212400      D   49             LXI   H,TEL
003B 220500      D   50             SHLD  TELPNT
003E CD8800      C   51             CALL  ZEROSR
0041 2A0300      D   52             LHLD  STRTBL
0044 06D1            53             MVI   B,01H
0046 3EA0            54  AGAIN:     MVI   A,0A0H
0048 D309            55             OUT   PRTOUT
004A 3E08            56             MVI   A,08H
004C D307            57             OUT   07H
004E 3E04            58  WAIT2:     MVI   A,04H
0050 CDF100      C   59             CALL  ACON
0053 B7              60             ORA   A
0054 C24E00      C   61             JNZ   WAIT2
0057 CDA800      C   62             CALL  GETSR
005A 78              63             MOV   A,B
005B FE01            64             CPI   01H
005D CA6100      C   65             JZ    NXTBYT
0060 23              66             INX   H
0061 0601            67  NXTBYT:    MVI   B,01H
0063 3E1E            68             MVI   A,1EH
0065 D306            69             OUT   06H
0067 3E09            70             MVI   A,09H
0069 D307            71             OUT   07H
006B 3E04            72  INCTS:     MVI   A,04H
006D CDF100      C   73             CALL  ACON
0070 B7              74             ORA   A
0071 CA6B00      C   75             JZ    INCTS
0074 3E03            76  INTST:     MVI   A,03H
0076 CDF100      C   77             CALL  ACON
0079 B7              78             ORA   A
007A CA8700      C   79             JZ    GETOUT
007D CD8800      C   80             CALL  ZEROSR
0080 3E1B            81             MVI   A,1BH
0082 D306            82             OUT   06H
0084 C34600      C   83             JMP   AGAIN
0087 C9              84  GETOUT:    RET
                     85  ;;;;;;;;;;;;;;;;;;;;;;;;;;;;;;;;;;;;;;;;;;;;;;;;;;;;;;;;;;;
                     86  ;
0088 E5              87  ZEROSR:    PUSH  H
0089 21010C          88             LXI   H,3073D
008C 3E80            89             MVI   A,80H
008E D309            90             OUT   PRTOUT
0090 CD9F00      C   91  LPA:       CALL  CLKSR
0093 2B              92             DCX   H
0094 7C              93             MOV   A,H
```

```
0095 B5            94              ORA L
0096 C29000    C   95              JNZ LPA
0099 3EA0          96              MVI A,0A0H
009B D309          97              OUT PRTOUT
009D E1            98              POP H
009E C9            99              RET
                  100  ;************************************************
009F 3E01         101  CLKSR: MVI A,SSCLK
00A1 D307         102         OUT CNTL
00A3 3E00         103         MVI A,RSCLK
00A5 D307         104         OUT CNTL
00A7 C9           105         RET
                  106  ;************************************************
00A8 E5           107  GETSR: PUSH H
00A9 2A0500   D   108         LHLD TBLPNT
00AC 5E           109         MOV E,M
00AD 23           110         INX H
00AE 56           111         MOV D,M
00AF 23           112         INX H
00B0 220500   D   113         SHLD TBLPNT
00B3 3E80         114         MVI A,80H
00B5 D309         115         OUT 09H
00B7 CD9F00   C   116  ZERO:  CALL CLKSR
00BA 1B           117         DCX D
00BB 7B           118         MOV A,E
00BC B2           119         ORA D
00BD C2B700   C   120         JNZ ZERO
00C0 2A0500   D   121         LHLD TBLPNT
00C3 5E           122         MOV E,M
00C4 23           123         INX H
00C5 56           124         MOV D,M
00C6 23           125         INX H
00C7 220500   D   126         SHLD TBLPNT
00CA E1           127         POP H
                  128  ;************************************************
00CB DB05         129  LPB:   IN PORTIN
00CD E610         130         ANI QSRMSK
00CF CAD400   C   131         JZ CA
00D2 3EFF         132         MVI A,0FFH
00D4 A0           133  CA:    ANA B
00D5 4F           134         MOV C,A
00D6 78           135         MOV A,B
00D7 2F           136         CMA
00D8 A6           137         ANA M
00D9 B1           138         ORA C
00DA 77           139         MOV M,A
00DB CD9F00   C   140         CALL CLKSR
00DE 78           141         MOV A,B
00DF 37           142         STC
00E0 3F           143         CMC
00E1 17           144         RAL
00E2 47           145         MOV B,A
00E3 B7           146         ORA A
00E4 C2EA00   C   147         JNZ OK
00E7 0601         148         MVI B,01H
00E9 23           149         INX H
00EA 1B           150  OK:    DCX D
00EB 7A           151         MOV A,D
00EC B3           152         ORA E
00ED C2CB00   C   153         JNZ LPB
00F0 C9           154         RET
00F1 32F1DF       155  ACON:  STA MUXGN
00F4 3E01         156         MVI A,01H
00F6 32F0DF       157         STA ADCR
00F9 3AF0DF       158  FINCON: LDA ADCR
00FC 07           159         RLC
00FD D2F900   C   160         JNC FINCON
0100 3AF5DF       161         LDA AD
0103 FE40         162         CPI 40H
0105 3E00         163         MVI A,00H
0107 D0           164         RNC
0108 3E01         165         MVI A,01H
```

```
010A C9              166         RET
010B CD8332          167 PTSR:   CALL GETPAR
010E 46              168         MOV B,M
010F 05              169         DCR B
0110 C5              170         PUSH B
0111 CD8332          171         CALL GETPAR
0114 EB              172         XCHG
0115 C1              173         POP B
0116 210A00    D     174         LXI H,PL8TBL
0119 78              175 LP1:    MOV A,B
011A B7              176         ORA A
011B CA2A01    C     177         JZ Y0
011E 7B              178 N0:     MOV A,E
011F 86              179         ADD M
0120 5F              180         MOV E,A
0121 23              181         INX H
0122 7A              182         MOV A,D
0123 8E              183         ADC M
0124 57              184         MOV D,A
0125 23              185         INX H
0126 05              186         DCR B
0127 C31901    C     187         JMP LP1
012A D5              188 Y0:     PUSH D
012B 5E              189         MOV E,M
012C 23              190         INX H
012D 56              191         MOV D,M
012E E1              192         POP H
012F 3EC0            193         MVI A,0C0H
0131 D309            194         OUT PRTOUT
0133 CD8800    C     195         CALL ZEROSR
0136 3EC0            196         MVI A,0C0H
0138 D309            197         OUT PRTOUT
013A CD9F00    C     198         CALL CLKSR
013D 0601            199 LP2:    MVI B,01H
013F 7E              200 LP3:    MOV A,M
0140 A0              201         ANA B
0141 C24901    C     202         JNZ N1
0144 3EC0            203 Y1:     MVI A,0C0H
0146 C34B01    C     204         JMP C1
0149 3E80            205 N1:     MVI A,80H
014B D309            206 C1:     OUT 09H
014D CD9F00    C     207         CALL CLKSR
0150 78              208         MOV A,B
0151 17              209         RAL
0152 47              210         MOV B,A
0153 D23F01    C     211         JNC LP3
0156 23              212 Y2:     INX H
0157 1B              213         DCX D
0158 7B              214         MOV A,E
0159 E2              215         ORA D
015A C23D01    C     216         JNZ LP2
015D DB05            217 LP5:    IN 05H
015F E610            218         ANI GSRMSK
0161 C26A01    C     219         JNZ N4
0164 CD9F00    C     220         CALL CLKSR
0167 C35D01    C     221         JMP LP5
016A CD9F00    C     222 N4:     CALL CLKSR
016D 3EE0            223         MVI A,0E0H
016F D309            224         OUT PRTOUT
0171 C9              225         RET
                     226         DSEG
0000                 227 EDGNUM: DS 2
0002                 228 MODE:   DS 1
0003                 229 STRTBL: DS 2
0005                 230 TBLPNT: DS 2
0007                 231 BITMSK: DS 1
0008                 232 OUTPRT: DS 2
000A 0101            233 PL8TBL: DW 257,258,256,258
000C 0201
000E 0001
0010 0201
0012 0201            234         DW 258,258,256,256
```

```
0014 0201
0016 0001
0018 0001
001A 0001         235        DW 256,256,256,258
001C 0001
001E 0001
0020 0201
0022 F500         236        DW 245
0024 FE03         237 TBL:   DW 1022,2050,1008,2064,1024,2048,1008,2064
0026 0208
0028 F003
002A 1008
002C 0004
002E 0008
0030 F003
0032 1008
0034 F003         238        DW 1008,2064,1008,2064,1024,2048,1024,2048
0036 1008
0038 F003
003A 1008
003C 0004
003E 0008
0040 0004
0042 0008
0044 0004         239        DW 1024,2048,1024,2048,1008,2064,1010,1062
0046 0008
0048 0004
004A 0008
004C F003
004E 1008
0050 F203
0052 2604
0054 5C04         240        DW 1116,1956
0056 A407
                  241 END
```

PUBLIC SYMBOLS
ACON    C 00F1    FAST    C 0027    PTSR    C 010B

EXTERNAL SYMBOLS

USER SYMBOLS
ACON    C 00F1    AD      A DFF5    ADCR    A DFF0    AGAIN   C 004     BITMSK  D 0007
CLKSR   C 009F    CNTL    A 0007    EDGNUM  D 0000    FAST    C 002'    FINCON  C 00F9
GETSR   C 00A8    INCTS   C 006B    INTST   C 0074    LOWER   C 001     LP1     C 0119
LP5     C 015D    LPA     C 0090    LPB     C 00CB    MODE    D 000'    MUXGN   A DFF2
N4      C 016A    NXTBYT  C 0061    OK      C 00EA    OUTPRT  D 000'    PL8TBL  D 000A
PRTOUT  A 0009    PTSR    C 010B    QSRMSK  A 0010    RMC     A 000'    RSCLK   A 000C
STRM3   C 0000    STRTBL  D 0003    TBL     D 0024    TBLPNT  D 000'    WAIT2   C 004E
Y2      C 0156    ZERO    C 00B7    ZEROSR  C 0088

ASSEMBLY COMPLETE,  NO ERRORS

LASER1.EDT:470   5 M-Y 81              DISK NAME:  .RU-GRAMS
DATE 25-SEP-84        TIME   11:18       PAGE    1 OF   24

```
1.0100 *
1.0200 *   ROME AIR DEVELOPMENT CENTER, GRIFFISS AFB.
1.0300 *
1.0400 *              MARK PRONOBIS
1.0500 *              DANIEL BURNS
1.0600 *              CHARLES ELDERING
1.0700 *         (315) 330-4995, AUTOVON 587-4995
1.0800 *
1.0900 * THIS PROGRAM IS WRITTEN TO RUN ON A TEKTRONIX S-3260
1.1000 * AUTOMATIC IC TESTER. THE PROGRAM EXECUTES THE MIL-SPEC
1.1100 * FUNCTIONAL TEST VECTOR SET FOR THE 1802 MICROPROCESSOR,
1.1200 * VARIES THE DEVICE POWER SUPPLY AND CLOCK FREQUENCY
1.1300 * AND PROVIDES AN INTERFACE TO THE MDS-220 COMPUTER.
1.1400 * DATA AND COMMANDS ARE TRANSFERED BETWEEN THE COMPUTERS
1.1500 * THROUGH A DATA COUPLER ACCESSED BY MEMORY LOCATION
```

```
1.1600  *  #166410 FOR INPUT AND LOCATION #166414 FOR OUTPUT.
1.1700  *
1.1800  *   SYSTEM SUBROUTINE AND FUNCTION DECLARATIONS
1.1900      SUBROUTINE PGPHAS(V,V,V):PGPHAS
1.2000      SUBROUTINE DRAW(V,V,V),CURSOR(V,V):GRAPH1
1.2100      SUBROUTINE VECTRF(V,V,V,V):GRAPH1
1.2200      FUNCTION CHARI(V):ADSTNG
1.2300      SUBROUTINE STRNGS(V,I,V),STRNGI(V,N,I,V,V):ADSTNG
1.2400      SUBROUTINE SCON(I,V,V,C),STRNGO(V,I,V,V):ADSTNG
1.2500      FUNCTION PINERR(I):SECDAT,STRNGF(I,V):ADSTNG
1.2600      SUBROUTINE EVS6(0),EVS5(0),DVS6(0),DVS5(0):MC3
1.2700      SUBROUTINE CRDATE(V):TIME
1.2800      SUBROUTINE SHIFT(N,V):PLI
1.2900      SUBROUTINE CLARY(F,V),DCLARY(F,V,V,V),STARY(V,F,V,V):DKARY
1.3000      FUNCTION FTARY(F,V,V):DKARY
1.3100      SUBROUTINE PAKFIL(F,N,I,N,V):ADSTNG
1.3200      SUBROUTINE SETCLR(V),SETWRM(V):COLOR 2.0000  * ARRAYS
2.0010      IARRAY OTNAME(52),PATNUM(12)
2.0020      ARRAY CSTRT(3),CPW(3),CYCL(3),VVDD(3)
2.0030      ARRAY VVCC(3),VVIH(3),VVIL(3),FUNCTL(3,29)
2.0040      ARRAY VOH(3),VOL(3)
2.0050      SCON(OTNAME,1,49,",TPA,TPB,SC1,SC0,MA7,MA6,MA5,MA4,MA3,MA2,MA1,MA0,")
2.0060      SCON(OTNAME,50,89,"MWR,MRD,D07,D06,D05,D04,D03,D02,D01,D00,")
2.0070      SCON(OTNAME,90,101,"N2,N1,N0,Q*")
2.0080      SCON(PATNUM,1,20,"0123456789ABCDEFGHIJ")
2.0090      IARRAY IBD(50)
2.0100      ARRAY FPBD(25)
2.0110      EQUIVALENCE FPBD WITH IBD
2.0120      IARRAY IBUF(25)
2.0130      IARRAY COMM(25)
2.0140      ARRAY PL(13),PLT(13)
2.0150      IARRAY HISTO(512)

3.0000  * PINLISTS
3.0010      PINLIST ADDRESS=MA7,MA6,MA5,MA4,MA3,MA2,MA1,MA0
3.0020      PINLIST DATOUT=D07,D06,D05,D04,D03,D02,D01,D00
3.0030      PINLIST DATAIN=D17,D16,D15,D14,D13,D12,D11,D10
3.0040      PINLIST MI1=TPAMSK,TPBMSK,SCMASK,MAMASK,MWRMSK
3.0050      PINLIST MI2=MRDMSK,INHHI,DATMSK,NMASK,QMASK
3.0060      PINLIST MSKIHB=MI1,MI2
3.0070      PINLIST TP=TPA,TPB
3.0080      PINLIST SC=SC1,SC0
3.0090      PINLIST MRW=MWR,MRD
3.0100      PINLIST XCTRL=DMAIN,DMAOT,INTRP
3.0110      PINLIST NPINS=N2,N1,N0
3.0120      PINLIST EFPINS=EF4,EF3,EF2,EF1
3.0130      PINLIST POWER=VDD,VCC
3.0140      PINLIST INS=WATE,CLR,DATAIN,XCTRL,EFPINS
3.0150      PINLIST OUTS=TP,SC,ADDRES,MRW,DATOUT,NPINS,Q
3.0160      PINLIST OUTS1=TP,SC,ADDRES,MRW,NPINS,Q
3.0170      PINLIST OUTEND=TPA,MWR,DATOUT,SC,NPINS
3.0180      PINLIST OUTMID=TPB,ADDRES,MRD,Q
3.0190      PINLIST PHAINS=CLOCK,WATE,CLR,EFPINS,XCTRL
3.0200      PINLIST INS1=CLOCK,INS
3.0210      PINLIST INS3=CLR,CLOCK,WATE,XCTRL,EFPINS
3.0220      PINLIST ALL=TP,WATE,CLR,SC,ADDRES,MRW,DATAIN,DATOUT,XCTRL,NPINS,EFPII
3.0230      PINLIST DUMMY=X,X,X,X,X,X,X,X,X,X
3.0240      PINLIST ALLA=ALL,MSKIHB,DUMMY
3.0250      PINLIST ALLB=ALL,DUMMY,MSKIHB
3.0260      PINLIST ALLMV=ALL
3.0270      PINLIST ACOUTS=TP,MRW,Q,NPINS
3.0280      PINLIST ACPINS=CLOCK,ACOUTS 4.0000  * PRESETS
4.0010      VVDD(1)=4
4.0020      FMAX=4000
4.0025      CALL 10.008
4.0110      LINES=0
4.0120      MODE=0
4.0130      TTY=1
```

```
4.0135      LP=9
4.0140      ENDPAT=13
4.0145    * PL CONTAINS # EDGES=2*  #CLOCK CYCLES                              2064
4.0150      PRESET PL(1)=2050,2064,2048,2064,2064,2064,2048,2048,2048,2048,2064
4.0160      LOOP 4.018 I=1,13
4.0170      PLT(I)=PL(I)
4.0180      CONTINUE
4.0190      INIMOD=#000040
4.0200      PASMSK=#000010
4.0210      FAILMS=#000000
4.0220      TSTMSK=#000020
4.0230      CTSMSK=#000040
4.0240      NOTCTS=#000000
4.0250      SNTMSK=#004000
4.0260      MODMSK=#003400
4.0270      DATMSK=#000377
4.0280      IPORT=#166410
4.0290      OPORT=#166414

5.0000    * WAIT FOR COMMANDS
5.0025      LINES=LINES+3
5.0026      CALL 1002.0
5.0030      PRINT CR," 1-3260 MASTER"
5.0040      PRINT CR," 0-MDS220 MASTER"
5.0050      ACCEPT CR," OPERATION ?",MASTER
5.0055      INITIALIZE
5.0056      CONNECT INPUT TO GROUND ON ALLA
5.0057      CONNECT OUTPUT TO GROUND ON ALLA
5.0058      SETBUS(CTSMSK,OPORT)
5.0060      IF (MASTER EQ 1) 5.018
5.0110      CALL 5.1
5.0150      IF(COM LT 0 OR COM GT 7) 5.011
5.0155      IF(COM NE 5) 5.016
5.0156      MASTER=1
5.0157      GO TO 5.018
5.0160      CALL(COM+1) 6.0,7.0,8.0,9.0,12.0,6.0,6.0,19.0
5.0165    *              0   1 2  3    4    5   6   7
5.0166    * WAIT,G/NG,DIE PR,TRANS BS,VDD MIN,3260 MASTER, NOT USED,CYC DP
5.0170      GOTO 5.011
5.0175    * 3260 MASTER LOOP
5.0180      LINES=LINES+18
5.0190      CALL 1002.0
5.0220      PRINT CR," SELECT OPTION:"
5.0230      PRINT CR," 0-WAIT"
5.0240      PRINT CR," 1-GO/NO GO TEST (STOP ON ERROR)"
5.0250      PRINT CR," 2-DIE PROBE BIT STREAM (ALL PATS)"
5.0260      PRINT CR," 3-TRANFER BIT STREAM TO 3260"
5.0270      PRINT CR," 4-CHANGE VDD, FREQUENCY FOR GO/NO GO TEST"
5.0280      PRINT CR," 5-FIND MAX FREQUENCY"
5.0290      PRINT CR," 6-NOT USED"
5.0300      PRINT CR," 7-NOT USED"
5.0310      PRINT CR," 8-CHECK INPUT-OUTPUT TO MDS-220"
5.0320      PRINT CR," 9-SHOW TEST CONDITIONS"
5.0325      PRINT CR,"10-TIMING MARGIN (MASTER ONLY)"
5.0326      PRINT CR,"11-LOOK AT BIT STREAMS"
5.0327      PRINT CR,"12-RETURN TO MDS220 MASTER"
5.0328      PRINT CR,"13-RUN TO 1ST 1"
5.0329      PRINT CR,"14-FMAX VS VDD"
5.0340      ACCEPT CR,"OPTION?",COM
5.0350      IF(COM LT 0 OR COM GT 14) 5.018
5.0354      IF(COM NE 12) 5.036
5.0355      MASTER=0
5.0357      GO TO 5.011
5.0360      IF(COM GT 11)5.039
5.0370      CALL (COM+1) 6.0,7.0,8.0,9.0,10.0,11.0,6.0,6.0,14.0,15.0,16.0,3000.0
5.0375    *              0   1   2   3   4    5    6   7   8    9
5.0376    *    10   11
5.0380      GO TO 5.018
5.0390      CALL (COM-11) 6.0,18.0,13.0
5.0395      GO TO 5.018
5.0900    *
5.1000    * GET COMMAND FROM MDS220
```

```
5.1010    IN=GETBUS(IPORT)
5.1020    IN=GETBUS(IPORT)
5.1030    COM=AND(IN,MODMSK)/256
5.1040    SENT=AND(IN,SNTMSK)/2048
5.1045    DAT=AND(IN,DATMSK)
5.1050    RETURN 6.0000  * WAIT MODE 0 ACTION
6.0010    IF(MODE EQ 0) 6.005
6.0020    MODE=0
6.0021    IF(MASTER EQ 0) 6.003
6.0025    CALL 1003.0
6.0030    CALL 1002.0
6.0040    PRINT CR,"WAITING FOR COMMAND"
6.0050    RETURN 7.0000  * GO NOGO TEST
7.0005    IF(MASTER EQ 0) 7.0025
7.0010    ACCEPT CR,"VDD,FMAX=",VVDD(1),FMAX
7.0025    CALL 10.008
7.0030    MODE=1
7.0040    STPERR=1
7.0050    CALL 1002.0
7.0060    PRINT CR,"RUNNING GO/NOGO TEST"
7.0070    CALL 100.0
7.0080    CALL 1003.0
7.0090    SETBUS(OR(CTSMSK,RESULT),OPORT)
7.0100    RETURN 8.0000  * DIE PROBE TEST
8.0010    MODE=2
8.0020    STPERR=1
8.0030    VVDD(1)=3
8.0040    FMAX=4000
8.0050    CALL 10.008
8.0060    CALL 1002.0
8.0070    PRINT CR,"DIE PROBE TEST RUNNING"
8.0080    CALL 100.0
8.0090    CALL 1003.0
8.0100    RETURN 9.0000  * TRANFER TO 3260
9.0010    MODE=3
9.0020    CALL 1002.0
9.0030    PRINT CR,"TRANSFER BIT STREAM FROM 220 TO 3260 DISK FILE"
9.0040  * GET HEADER ARRAY LENGTH, DATA AND STORE
9.0050    CALL 1011.16
9.0055    PRINT IBD(50)
9.0060    IBD(1)=IBD(50)
9.0070    LOOP 9.01 I=2,IBD(1)/2
9.0080    CALL 1011.16
9.0090    IBD(I)=IBD(50)
9.0095    CALL 1002.0
9.0096    PRINT CR,"IBD(",I:12C,")=",IBD(I)
9.0100    CONTINUE
9.0110    LOOP 9.014 I=8,13
9.0130    STRNGS(IBD(I),IBUF,I-7)
9.0140    CONTINUE
9.0150    SCON(IBUF,6,14,"H.ARY:470")
9.0160    PFST=1
9.0170    PAKFIL(NAME1,X1,IBUF,PFST,14)
9.0180    L1=IBD(1)/2
9.0190    DCLARY(NAME1,0,L1,1)
9.0200    LOOP 9.022 N0=1,IBD(1)/2
9.0210    STARY(IBD(N0),NAME1,N0,1)
9.0215  * PRINT CR,"ADR,DAT=",N0,IBD(N0)
9.0220    CONTINUE
9.0230    CLARY(NAME1,0)
9.0235    CALL 1002.0

9.0236    PRINT CR,"HEADER FILE STORED"
9.0240  * NOW DATA FILE WITH XY'S,CYCLE/PAT'S AND STREAMS
9.0250  * FIGURE LENGTH OF DATA FILE
```

```
9.0260     L1=3
9.0270     LOOP 9.03 P=1,13
9.0280     N8=INT((PL(P)+7)/8)
9.0290     L1=L1+INT((N8+3)/4)
9.0300     CONTINUE
9.0310     SCON(IBUF,6,14,"D.ARY:470")
9.0320     PFST=1
9.0330     PAKFIL(NAME1,X1,IBUF,PFST,14)
9.0340     DCLARY(NAME1,0,IBD(6),L1)
9.0344     CALL 1002.0
9.0350   * DUMP N(0,0),N(1,0),N(2,0)
9.0355     CALL 1011.32
9.0360     CALL 1011.16
9.0400   * X IN HI 16, Y IN LOW 16
9.0410     LOOP 9.047 N=1,IBD(6)
9.0420     CALL 1011.16
9.0430     IBD(49)=IBD(50)
9.0440     CALL 1011.16
9.0460     STARY(FPBD(25),NAME1,N,1)
9.0465   * PATTERN/CYCLE OF 1ST "1" WILL BE FIGURED BY 3260
9.0466     CALL 1011.16
9.0467     IBD(49)=0
9.0468     STARY(FPBD(25),NAME1,N,2)
9.0470     CONTINUE
9.0620   * NOW BIT STREAMS
9.0622     LOOP 9.11 N=1,IBD(6)
9.0625     CP=0
9.0630     WD=4
9.0650     LOOP 9.11 P=1,13
9.0651     TOTAL=2
9.0654   * THIS IS FOR 1ST "1" FLAG
9.0655     CALL 1002.0
9.0656     PRINT CR,"STORING NODE/PAT=",N,P
9.0680     N8=INT((PL(P)+7)/8)
9.0690     N32=INT(N8/4)
9.0700     ODD8=N8-N32*4
9.0710     ODDO=4-ODD8
9.0720   * DO ALL FULL 32B WDS IN PATTERN
9.0730     LOOP 9.091 X1=1,N32
9.0750     CALL 1011.32
9.0780     STARY(FPBD(25),NAME1,N,WD)
9.0787   * CHECK FOR A 1 IN THIS WORD IF NONE ALREADY
9.0788     IF(CP NE 0) 9.09
9.0800     CALL 3000.3
9.0810     LOOP 9.088 I=17,47,2
9.0820   * 0=OFF 1=ON
9.0825   * PRINT CR,I,IBD(I)
9.0830     IF((IBD(I) NE 0) OR (X1 EQ 1)) 9.087
9.0840     CP=16*TOTAL+P
9.0844     CALL 1002.0
9.0845     PRINT CR,"FIRST 1 AT PAT/CY=",P,TOTAL
9.0850     STARY(CP,NAME1,N,2)
9.0860     GO TO 9.09
9.0870     TOTAL=TOTAL+2
9.0880     CONTINUE
9.0900     WD=WD+1
9.0910     CONTINUE
9.0920   * DO THE ODD 32B WD IF NECESSARY
9.0930     IF(ODD8 EQ 0) 9.11
9.0940     IF(ODD8 NE 1) 9.098
9.0950     CALL 1011.8
9.0960     IBD(50)=IBD(48)
9.0970     GO TO 9.1
9.0980     IF(ODD8 NE 2) 9.102
9.0990     CALL 1011.16
9.1000     IBD(49)=0
9.1010     GO TO 9.107
9.1020     CALL 1011.16
9.1030     TEMP=IBD(50)
9.1040     CALL 1011.8
9.1050     IBD(49)=IBD(48)
9.1060     IBD(50)=TEMP
```

```
9.1070     STARY(FPBD(25),NAME1,N,WD)
9.1090     WD=WD+1
9.1100     CONTINUE
9.1110     CLARY(NAME1,0)
9.1120     CALL 1002.0
9.1130     PRINT CR,"DONE TRANSFERRING STREAM"
9.1140     RETURN 10.0000  * CHANGE CONDITIONS
10.0010    LINES=LINES+2
10.0020    CALL 1002.0
10.0040    ACCEPT CR,"NEW VDD?",VVDD(1)
10.0050    ACCEPT CR,"NEW CLOC FREQUENCY (HZ)?",FMAX
10.0075  * ENTRY FOR MAX FREQ TEST
10.0080    CYCL(1)=10**9/FMAX
10.0090    VVCC(1)=VVDD(1)
10.0100    VOH(1)=0.5*VVCC(1)
10.0110    VOL(1)=0.5*VVCC(1)
10.0120    VVIH(1)=VVCC(1)
10.0130    VVIL(1)=0
10.0140    CPY(1)=0.5*CYCL(1)
10.0150    IF (FMAX LT 36000) 10.019
10.0160    CSTRT(1)=20
10.0170    SFCLK=1
10.0180    GO TO 10.021
10.0190    CSTRT(1)=512
10.0200    SFCLK=0
10.0210    RETURN 11.0000  * TEST MAX FREQ
11.0001    MODE=5
11.0002    STPERR=1
11.0003    IF(MASTER EQ 0) 11.002
11.0005    CALL 1002.0
11.0010    ACCEPT CR,"ENTER VDD FOR MAX FREQ TEST:",VVDD(1)
11.0020    FLAST=10*10**3
11.0025  * ENTRY FOR FMAX VS VDD
11.0040    F2=5*10**6
11.0050    F1=FLAST
11.0090    FMAX=F1
11.0100    GO TO 11.013
11.0110    FMAX=F1+(F2-F1)/2
11.0120    IF(ABS(FMAX-FLAST) LE (.01*FLAST)) 11.024
11.0130    CALL 1002.0
11.0140    PRINT CR,"LAST FREQ=",FLAST," TESTING VDD=",VVDD(1)," FREQ=",FMAX
11.0150    CALL 10.008
11.0160    CALL 100.0
11.0170    IF(BAD EQ 0) 11.02
11.0180    F2=FMAX
11.0190    GO TO 11.023
11.0200    F1=FMAX
11.0230    FLAST=FMAX
11.0235    GO TO 11.011
11.0240    IF(BAD EQ 0) 11.028
11.0250    FMAX=F1
11.0260    CALL 10.008
11.0280    IF(MODE NE 5) 11.033
11.0285    CALL 1003.0
11.0290    CALL 1002.0
11.0300    PRINT CR,"FMAX=",FMAX," FOR VDD=",VVDD(1)
11.0330    RETURN 12.0000  * VDDMIN FOR 4000HZ, IPHV FROM 220
12.0010    CALL 1002.0
12.0020    PRINT CR,"VDD MIN TEST AT 4000HZ"
12.0030    CALL 1011.16
12.0040    DUTSN=IBD(50)
12.0050    CALL 1011.16
12.0060    IPHI=IBD(50)
12.0070    CALL 1011.16
12.0080    IPHV=IBD(50)
12.0090    PFST=1
```

```
12.0100     SCON(IBUF,1,14,"DATPAP.ARY:470")
12.0110     PAKFIL(NAME1,X1,IBUF,PFST,14)
12.0120     DCLARY(NAME1,0,25,1350)
12.0130   * ZERO DATA IN SLOT
12.0140     LOOP 12.019 V20=1,25
12.0150     X=0
12.0160     STARY(X,NAME1,V20,DUTSN)
12.0170     STARY(X,NAME1,V20,DUTSN+50)
12.0180     STARY(X,NAME1,V20,100+(DUTSN-1)*25+IPHI)
12.0190     CONTINUE
12.0200   * STORE IPH VALUE
12.0210     STARY(IPHV,NAME1,25,100+(DUTSN-1)*25+IPHI)
12.0211     STPERR=1
12.0215     DONE=0
12.0220     V2=4.0
12.0230     V1=2.0
12.0240     MODE=2
12.0250     FMAX=4000
12.0260     VVDD(1)=V1+(V2-V1)/2
12.0270     IF(((VVDD(1)-V1) LE .01*V1) OR ((V2-VVDD(1))LE .01*V2)) 12.041
12.0280     CALL 1002.0
12.0290     PRINT CR,"TESTING VVDD(1)=",VVDD(1)
12.0300     CALL 10.008
12.0305   * PRINT CR,"GOING TO TEST "
12.0310     CALL 100.0
12.0315   * PRINT CR," BACK FROM TEST"
12.0316   * CTS=1,TST=0,DONE=0 OR J
12.0317     WAIT 100MS
12.0320     SETBUS(DONE,OPORT)
12.0330     CALL 5.1
12.0340     IF(SENT NE 1) 12.033
12.0350     SETBUS(OR(DONE,CTSMSK),OPORT)
12.0355     CALL 5.1
12.0356     IF(SENT NE 0) 12.0355
12.0360     IF(RESULT EQ PASMSK) 12.039
12.0370     V1=VVDD(1)
12.0380     GOTO 12.025
12.0390     V2=VVDD(1)
12.0400     GOTO 12.025
12.0410     IF(DONE EQ PASMSK) 12.043
12.0425     DONE=PASMSK
12.0426     GOTO 12.029
12.0430     CALL 1002.0
12.0431     PRINT CR,"DUTSN,IPHI,IPHV,VDDMIN=",DUTSN,IPHI,IPHV,VVDD(1)
12.0435     STARY(VVDD(1),NAME1,1,100+(DUTSN-1)*25+IPHI)
12.0440     CLARY(NAME1,0)
12.0445   * WAIT FOR 220 TO CHANGE MODE TO WAIT
12.0450     CALL 5.1
12.0452     IF(SENT NE 1) 12.045
12.0460     RETURN 13.0000   * FMAX VS VDD
13.0001     MODE=7
13.0002     STPERR=1
13.0003     LINES=LINES+7
13.0004     CALL 1002.0
13.0010     PRINT CR,"FMAX VS VDD TEST"
13.0020     ACCEPT CR,"DEVICE SERIAL #(1-50)",DUTSN
13.0030     ACCEPT CR,"NEW VOLTAGE LIMITS ?(0-NO 1-YES):",FLG
13.0040     IF(FLG NE 1) 13.007
13.0050     ACCEPT CR,"VMIN,VMAX,# MEASUREMENTS(1-20):",VMIN,VMAX,NV
13.0060     GO TO 13.01
13.0070     VMIN=1.0
13.0080     VMAX=5.0
13.0090     NV=9
13.0100     PFST=1
13.0110     SCON(IBUF,1,14,"DATPAP.ARY:470")
13.0120     PAKFIL(NAME1,X1,IBUF,PFST,14)
13.0130     DCLARY(NAME1,0,25,1350)
13.0140     ACCEPT CR,"IPH INDEX(1-25) AND VALUE:",IPHI,IPHV
13.0150     IF(IPHI NE 1) 13.018
13.0160     PRINT CR,"COMMENT (1-50 CHARS)"
```

```
13.0170     CALL 13.1
13.0180   * ZERO DATA IN SLOT
13.0190     LOOP 13.024 V20=1,25
13.0200     X=0
13.0210     STARY(X,NAME1,V20,DUTSN)
13.0220     STARY(X,NAME1,V20,DUTSN+50)
13.0230     STARY(X,NAME1,V20,100+(DUTSN-1)*25+IPHI)
13.0240     CONTINUE
13.0250   * STORE IPH VALUE
13.0260     STARY(IPHV,NAME1,25,100+(DUTSN-1)*25+IPHI)
13.0270     FLAST=1000
13.0280     LOOP 13.035 LP20=1,NV
13.0290     V20=VMIN+(LP20-1)/(NV-1)*(VMAX-VMIN)
13.0300     STARY(V20,NAME1,LP20,DUTSN)
13.0310     VVDD(1)=V20
13.0320     CALL 11.0025
13.0330     FLAST=FMAX
13.0340     STARY(FMAX,NAME1,LP20,100+(DUTSN-1)*25+IPHI)
13.0350     CONTINUE
13.0360     CLARY(NAME1,0)
13.0370     RETURN
13.1000   * GET DEVICE COMMENT
13.1030     LOOP 13.104 LP20=1,20
13.1035     SCOM(IBUF,LP20,LP20," ")
13.1040     CONTINUE
13.1050     STRNGI(TTY,COUNT,IBUF,1,20)
13.1060     LOOP 13.108 LP20=1,20
13.1070     X=IBUF(LP20)
13.1080     STARY(X,NAME1,LP20,DUTSN+50)
13.1090     RETURN 14.0000   * CHECK I/O TO MOS220
14.0005     CALL 1002.0
14.0010     ACCEPT CR,"CHECK INPUT OR OUTPUT (IN=0, OUT=1 2=RETURN)",I
14.0020     IF(I EQ 2) 14.028
14.0030     IF(I EQ 1) 14.017
14.0035   * CHECK INPUT
14.0040     MSK=1
14.0050     LOOP 14.013 I=0,15
14.0060     CALL 5.1
14.0080     IN=AND(IN,MSK)
14.0090     IF (IN EQ 0) 14.011
14.0100     IN=1
14.0105     CALL 1002.0
14.0110     PRINT CR,"BIT(",1:I2C,")=",IN:I1C
14.0120     SHIFT(MSK,+1)
14.0130     CONTINUE
14.0160     GO TO 14.0005
14.0165   * CHECK OUTPUT
14.0170     SETBUS(#000000,OPORT)
14.0175     LINES=LINES+6
14.0176     CALL 1002.0
14.0180     ACCEPT CR,"D3=D4=D5=0",I
14.0190     SETBUS(#000070,OPORT)
14.0200     ACCEPT CR,"D3=D4=D5=1",I
14.0210     SETBUS(#000010,OPORT)
14.0220     ACCEPT CR,"D3=1,D4=D5=0",I
14.0230     SETBUS(#000020,OPORT)
14.0240     ACCEPT CR,"D4=1,D3=D5=0",I
14.0250     SETBUS(#000040,OPORT)
14.0260     ACCEPT CR,"D5=1,D3=D4=0",I
14.0270     GO TO 14.0005
14.0280     RETURN 15.0000   * SHOW TST CONDITIONS
15.0010     LINES=LINES+13
15.0020     CALL 1002.0
15.0030     PRINT CR,"VDD=",VVDD(1),"VOLTS",CR,"VCC=",VVCC(1),"VOLTS"
15.0040     PRINT CR,"VIH=",VVIH(1),"VOLTS",CR,"VIL=",VVIL(1),"VOLTS"
15.0050     PRINT CR,"VOH=",VOH(1),"VOLTS",CR,"VOL=",VOL(1),"VOLTS"
15.0060     PRINT CR,"CYCL=",CYCL(1),"NS",CR,"CPW=",CPW(1),"NS"
15.0070     PRINT CR,"CYCL FREQUENCY=",10**9/CYCL(1)
```

```
15.0080     PRINT CR,"CSTRT=",CSTRT(1)
15.0090     PRINT CR,"COMPARE START=",CYCL(1)-30,CR,"COMPARE STOP=",CYCL(1)-10
15.0100     ACCEPT CR,"PRESS RETURN TO CONTINUE",X1
15.0110     RETURN 16.0000  *  MEASURE TIMING MARGINS
16.0001     MODE=10
16.0010     IF(MASTER EQ 1) 16.1
16.0020  *  GET REF NAME,BD,J,K FROM 220
16.0030     LOOP 16.0056 I=1,6
16.0040     CALL 1011.16
16.0044     CALL 1002.0
16.0048     PRINT CR,"IBD(I)=",IBD(I)
16.0052     STRNGS(IBD(50),IBUF,I)
16.0056     CONTINUE
16.0065  *  SETUP REF D FILE NAME
16.0070     SCON(IBUF,6,14,"D.ARY:470")
16.0080     PFST=1
16.0120     PAKFIL(NAME2,PDUM,IBUF,PFST,14)
16.0125  *  GET BD,J,K
16.0130     LOOP 16.016 I=1,14+2
16.0140     CALL 1011.16
16.0150     IBD(I)=IBD(50)
16.0160     CONTINUE
16.0170     J=IBD(15)
16.0180     K=IBD(16)
16.0185     PRINT CR,"J,K=",J,K
16.0190  *  SETUP TEST FILE NAMES
16.0200     LOOP 16.0225 I=1,5
16.0210     CHAR=IBD(I+7)
16.0220     STRNGS(CHAR,IBUF,I)
16.0225     CONTINUE
16.0230     PFST=1
16.0240     PAKFIL(NAME4,PDUM,IBUF,PFST,14)
16.0250     SCON(IBUF,6,6,"H")
16.0260     PFST=1
16.0270     PAKFIL(NAME3,PDUM,IBUF,PFST,14)
16.0280  *  OPEN TEST H AND STORE BD
16.0290     DCLARY(NAME3,0,14,1)
16.0300     LOOP 16.032 I=1,14
16.0310     STARY(IBD(I),NAME3,I,1)
16.0320     CONTINUE
16.0330     CLARY(NAME3,0)
16.0335     CALL 1002.0
16.0336     PRINT CR,"TEST HEADER FILE OUT OK"
16.0340  *  OPEN TEST DATA FILE
16.0350     DCLARY(NAME4,0,IBD(6),3)
16.0360  *  OPEN REF D FILE
16.0370     L1=3
16.0390     LOOP 16.042 P=1,13
16.0400     N8=INT((PL(P)+7)/8)
16.0410     L1=L1+INT((N8+3)/4)
16.0420     CONTINUE
16.0430     DCLARY(NAME2,0,IBD(6),L1)
16.0440  *  TRANSFER XY'S, PC'S
16.0450     LOOP 16.049 N=1,IBD(6)
16.0460     LOOP 16.049 P=1,2
16.0470     FPBD(25)=FTARY(NAME2,N,P)
16.0475     IF(P NE 1) 16.048
16.0476     CALL 1002.0
16.0477     PRINT CR,"X,Y=",IBD(49),IBD(50)
16.0480     STARY(FPBD(25),NAME4,N,P)
16.0490     CONTINUE
16.0495     CALL 1002.0
16.0496     PRINT CR,"TEST FILE SET UP OK"
16.0500     CLARY(NAME2,0)
16.0505  *  MAIN LOOP TO MEASURE MARGINS
16.0510     LOOP 16.079 N=J,K
16.0515     CALL 5.1
16.0520     IF(SENT EQ 0) 16.0515
16.0525  *  GO TO 1ST "1"
16.0530     STPERR=1
```

```
16.0535     VVDD(1)=4
16.0540     FMAX=4000
16.0542     CALL 10.008
16.0545     CP=FTARY(NAME4,N,2)
16.0550     TOTAL=INT(CP/16)
16.0555     ENDPAT=CP-16*TOTAL
16.0560     PLT(ENDPAT)=TOTAL
16.0565     PRINT CR,"BEFORE RUN TO 1 ENDPAT,TOTAL=",ENDPAT,PLT(ENDPAT)
16.0570     CALL 100.0
16.0575     CALL 1002.0
16.0580     PRINT CR,"WAITING FOR MIRROR DITHER AT NODE ",N
16.0585     CALL 5.1
16.0590     IF(SENT EQ 0) 16.0585
16.0595   * FINISH TEST SEQUENCE AND RUN MAX FREQ TEST
16.0710     CALL 100.029
16.0713     PLT(ENDPAT)=PL(ENDPAT)
16.0714     ENDPAT=13
16.0715     VVDD(1)=3
16.0717     CALL 11.0000
16.0720     STARY(FMAX,NAME4,N,3)
16.0730     CALL 1002.0
16.0740     PRINT CR,"NODE #, FMAX=",N,FMAX
16.0750     SETBUS(NOTCTS,OPORT)
16.0760     CALL 5.1
16.0770     IF(SENT EQ 0) 16.076
16.0780     SETBUS(CTSMSK,OPORT)
16.0785     CALL 5.1
16.0787     IF(SENT NE 0) 16.0785
16.0790     CONTINUE
16.0800     CLARY(NAME4,0)
16.0810     CALL 1002.0
16.0820     PRINT CR,"DONE WITH ALL NODES"
16.0830     RETURN
16.1000     RETURN 17.0000     RETURN
18.0000   * 3260 MANUAL RUN TO FIRST 1
18.0010     MODE=10
18.0020     STPERR=1
18.0030     VVDD(1)=4
18.0040     FMAX=4000
18.0050     ACCEPT CR,"ENDPAT,BIT NO. =",ENDPAT,TOTAL
18.0060     PLT(ENDPAT)=TOTAL
18.0070     CALL 100.0
18.0090     ACCEPT CR,"AT 1ST 1,PRESS RETURN TO CONTINUE",X
18.0100     PLT(ENDPAT)=PL(ENDPAT)
18.0110     ENDPAT=13
18.0120     CALL 100.029
18.0130     RETURN 19.0000   * CYCLE IN DIE PROBE MODE (MASTER=0 ONLY)
19.0010     MODE=19
19.0020     CALL 8.002
19.0030     CALL 5.1
19.0040     IF(COM EQ 7) 19.002
19.0050     RETURN 100.0000  * TEST DEVICE
100.0005  * TST=1,CIS=1
100.0010    SETBUS(OR(ISTMSK,CTSMSK),OPORT)
100.0020    DISCONNECT INPUT FROM GROUND ON ALLA
100.0030    DISCONNECT OUTPUT FROM GROUND ON ALLA
100.0040    CONNECT LOAD1 ON POWER
100.0050    CONNECT OUTPUT TO GROUND ON VSS
100.0060    CONNECT INPUT TO DRIVER ON INS3
100.0070    CONNECT OUTPUT TO COMPARATOR ON OUTS
100.0080    CONNECT TO PHASE ON CLOCK
100.0090    CONNECT LOAD1 ON OUTS1
100.0100  * 5=VDD 6=VCC
100.0110    EVS5
100.0120    VS5=VVDD(1),100MA
100.0130    EVS6
```

```
100.0140    VS6=VVCC(1),100MA
100.0150    FUNCTL(1,27)=0
100.0160    LOAD FROM DISK C18020 TO ALLA
100.0170    TOTAL=0.5*PLT(1)
100.0180    CALL 101.002
100.0190    CALL 102.0
100.0200    CALL 103.0
100.0210    HICOMPARE=VOH(1) AT 5V ON OUTS
100.0220    LOCOMPARE=VOL(1) AT 5V ON OUTS
100.0230    CALL 250.0
100.0240    IF(LOWV NE 0) 100.027
100.0250    CALL 104.0
100.0260    CALL 105.0
100.0265  * TST=0,CTS=1,PASS=0 OR 1
100.0270    SETBUS(OR(CTSMSK,RESULT),OPORT)
100.0280    IF(MODE EQ 10) 100.047
100.0290    INHIBIT DATAIN WITH ONE
100.0300    DISCONNECT INPUT FROM DRIVER ON DATAIN
100.0310    LODRIVE=0V ON INS
100.0320    HIDRIVE=0V ON INS
100.0330    DISCONNECT INPUT FROM DRIVER ON INS1
100.0340    VS6=0V,10MA
100.0350    VS5=0V,10MA
100.0360    DVS5
100.0370    DVS6
100.0380    DISCONNECT LOAD1 ON POWER
100.0390    DISCONNECT LOAD1 ON OUTS
100.0400    CONNECT TO DATAPHASE ON PHAINS
100.0410    INITIALIZE
100.0420    DISCONNECT INPUT FROM DRIVER ON ALLA
100.0430    DISCONNECT OUTPUT FROM LOAD1 ON ALLA
100.0440    DISCONNECT OUTPUT FROM COMPARATOR ON ALLA
100.0450    CONNECT INPUT TO GROUND ON ALLA
100.0460    CONNECT OUTPUT TO GROUND ON ALLA
100.0470    RETURN 101.0000  * INCREMENT PATTERN COUNTER
101.0010    PAT=PAT+1
101.0020    CONNECT REGISTER TO DBUS ON MSKIHB
101.0030    CONNECT DBUS TO SECTOR ON OUTS
101.0040    RETURN 102.0000  * ESTABLISH TIMING AND VOLTAGE LEVELS
102.0010    CLKSTR=CSTRT(1)
102.0020    CLKPW=CPW(1)
102.0030    CYC=CYCL(1)
102.0040    VDD=VVDD(1)
102.0050    VCC=VVCC(1)
102.0060    VIH=VVIH(1)
102.0070    VIL=VVIL(1)
102.0080    RETURN 103.0000  * TIMING
103.0010    CYCLE=CYC*1NS
103.0020    PGPHAS(CLKSTR*1NS,CLKPW*1NS,1)
103.0030    RETURN 104.0000  * DRIVE LEVELS FOR DATA IN (ASSUMES PATTERN ALREADY LOADED)
104.0010    CLEAR ERROR
104.0020    MOVE REGISTER(14) TO ALLMV
104.0030    LODRIVE=0V ON DATAIN
104.0040    CONNECT INPUT TO DRIVER ON DATAIN
104.0050    HIDRIVE=VIH*1V ON DATAIN
104.0060    LODRIVE=VIL*1V ON DATAIN
104.0070    FORCE DATAIN WITH PATTERN
104.0080    INHIBIT DATAIN WITH PATTERN
104.0090    RETURN 105.0000  * CONTROL FOR RUNNING 13 PATTERNS
105.0010    WHEN ERROR 107.0
105.0020    PAT=0
105.0030    PAD=0
```

```
105.0040    LOAD FROM DISK C18020 TO ALLA
105.0050    CALL 101.0
105.0060    TOTAL=0.5*PLT(1)
105.0070    CALL 106.0
105.0080    IF(PAT EQ ENDPAT) 105.081
105.0090    IF(BAD NE 0 AND STPERR EQ 1) 105.087
105.0100    LOAD FROM DISK C18021 TO ALLA
105.0110    CALL 101.0
105.0120    TOTAL=0.5*PLT(2)
105.0130    CALL 106.0
105.0140    IF(PAT EQ ENDPAT)105.081
105.0150    IF(BAD NE 0 AND STPERR EQ 1) 105.087
105.0160    LOAD FROM DISK C18022 TO ALLA
105.0170    CALL 101.0
105.0180    TOTAL=0.5*PLT(3)
105.0190    CALL 106.0
105.0200    IF(PAT EQ ENDPAT)105.081
105.0210    IF(BAD NE 0 AND STPERR EQ 1) 105.087
105.0220    LOAD FROM DISK C18023 TO ALLA
105.0230    CALL 101.0
105.0240    TOTAL=0.5*PLT(4)
105.0250    CALL 106.0
105.0260    IF(PAT EQ ENDPAT)105.081
105.0270    IF(BAD NE 0 AND STPERR EQ 1) 105.087
105.0280    LOAD FROM DISK C18024 TO ALLA
105.0290    CALL 101.0
105.0300    TOTAL=0.5*PLT(5)
105.0310    CALL 106.0
105.0320    IF(PAT EQ ENDPAT)105.081
105.0330    IF(BAD NE 0 AND STPERR EQ 1) 105.087
105.0340    LOAD FROM DISK C18025 TO ALLA
105.0350    CALL 101.0
105.0360    TOTAL=0.5*PLT(6)
105.0370    CALL 106.0
105.0380    IF(PAT EQ ENDPAT)105.081
105.0390    IF(BAD NE 0 AND STPERR EQ 1) 105.087
105.0400    LOAD FROM DISK C18026 TO ALLA
105.0410    CALL 101.0
105.0420    TOTAL=0.5*PLT(7)
105.0430    CALL 106.0
105.0440    IF(PAT EQ ENDPAT)105.081
105.0450    IF(BAD NE 0 AND STPERR EQ 1) 105.087
105.0460    LOAD FROM DISK C18027 TO ALLA
105.0470    CALL 101.0
105.0480    TOTAL=0.5*PLT(8)
105.0490    CALL 106.0
105.0500    IF(PAT EQ ENDPAT)105.081
105.0510    IF(BAD NE 0 AND STPERR EQ 1) 105.087
105.0520    LOAD FROM DISK C18028 TO ALLA
105.0530    CALL 101.0
105.0540    TOTAL=0.5*PLT(9)
105.0550    CALL 106.0
105.0560    IF(PAT EQ ENDPAT)105.081
105.0570    IF(BAD NE 0 AND STPERR EQ 1) 105.087
105.0580    LOAD FROM DISK C18029 TO ALLA
105.0590    CALL 101.0
105.0600    TOTAL=0.5*PLT(10)
105.0610    CALL 106.0
105.0620    IF(PAT EQ ENDPAT)105.081
105.0630    IF(BAD NE 0 AND STPERR EQ 1) 105.087
105.0640    LOAD FROM DISK C1802A TO ALLA
105.0650    CALL 101.0
105.0660    TOTAL=0.5*PLT(11)
105.0670    CALL 106.0
105.0680    IF(PAT EQ ENDPAT)105.081
105.0690    IF(BAD NE 0 AND STPERR EQ 1) 105.087
105.0700    LOAD FROM DISK C1802B TO ALLA
105.0710    CALL 101.0
105.0720    TOTAL=0.5*PLT(12)
105.0730    CALL 106.0
105.0740    IF(PAT EQ ENDPAT)105.081
105.0750    IF(BAD NE 0 AND STPERR EQ 1) 105.087
```

```
105.0760    LOAD FROM DISK C1802C TO ALLA
105.0770    CALL 101.0
105.0780    TOTAL=0.5*PLT(13)
105.0790    CALL 106.0
105.0810    IF(BAD NE 0) 105.087
105.0820  * BAD IS SET IN ERROR ROUTINE IN 107.0
105.0830    RESULT=PASMSK
105.0840    CALL 1002.0
105.0850    PRINT CR,"DEVICE PASSED!!!!!!!!"
105.0860    GO TO 105.09
105.0870    RESULT=FAILMS
105.0880    CALL 1002.0
105.0890    PRINT CR,"DEVICE FAILED!!!!!!!!"
105.0900    RETURN 106.0000  * FUNCTIONAL TEST SEQUENCE
106.0010    NXTCYC=1
106.0020    MASK OUTS WITH ONE
106.0030    MASK OUTEND WITH PATTERN
106.0040    IF (SFCLK EQ 1) 106.008
106.0050    PGPHAS ( (CYC - 1024)* 1NS,512NS,5)
106.0060    PGPHAS ( (CYC - 1024)*1NS,512NS,6)
106.0070    GO TO 106.01
106.0080    PGPHAS ( (CYC-30)*1NS,20*1NS,5)
106.0090    PGPHAS ( (CYC-30)*1NS,20*1NS,6)
106.0100    IF  (MASTER EQ 1) 106.015
106.0104    IF (MODE NE 2) 106.015
106.0105  * WAIT TILL MDS220 TRIGGERS TEST  (SEMI=1)
106.0110    CALL 5.1
106.0140    IF (SENT NE 1) 106.011
106.0145  * NEXT STATEMENT RUNS PATTERN PAT
106.0150    MOVE REGISTER (TOTAL) TO ALLMV
106.0160    CALL 1002.0
106.0170    PRINT CR,"PATTERN #",PAT:I2," DONE..." ERRORS= ";BAD
106.0180    IF (MASTER EQ 1) 106.032
106.0185    IF (MODE NE 2) 106.032
106.0190  * TELL MDS220 TO DUMP SR  (CTS=0) AND WAIT TILL DONE  (SENT=1)
106.0210    SETBUS (TSTMSK,OPORT)
106.0220    CALL 5.1
106.0250    IF (SENT NE 0) 106.022
106.0255  * TELL 220 READY TO DO NEXT PATTERN  (CST=1) AND
106.0260  * IF LAST PATTERN DONE RESET TST TO 0
106.0270    IF (PAT NE 13) 106.031
106.0280    SETBUS (CTSMSK,OPORT)
106.0290    WAIT 500S
106.0300    GOTO 106.032
106.0310    SETBUS (OR (CTSMSK,TSTMSK),OPORT)
106.0320    RETURN
107.0000  * LOGERR ON OUTS
107.0010    BAD=BAD+1
107.0020    RETURN 250.0000  * POWER SUPPLIES,DRIVE LEVELS & FORCE STATEMENTS
250.0200    INHIBIT DATAIN WITH ONE
250.0400    DISCONNECT INPUT FROM DRIVER ON DATAIN
250.0600    LODRIVE=0V ON INS1
250.0800    DISCONNECT INPUT FROM DRIVER ON INS1
250.1000    HIDRIVE=0V ON INS1
250.1200    CONNECT INPUT TO DRIVER ON INS3
250.1400    HIDRIVE=0V ON INS1
250.1600    VS6=0V,10MA
250.1800    VS5=VDD*1V,100MA
250.2000    VS6=VCC*1V,100MA
250.2100    CALL 251.0
250.2150    IF(LOWV NE 0) 250.9
250.2400    HIDRIVE=VIH*1V ON INS1
250.2600    LODRIVE=VIL*1V ON INS1
250.3000    FORCE INS WITH PATTERN
250.3200    FORCE CLOCK WITH ONE,RZ,INVERT
250.3400    INHIBIT DATAIN WITH PATTERN
250.3600    COMPARE OUTS WITH PATTERN
250.3800    MASK OUTS WITH PATTERN
```

```
250.9000    RETURN 251.0000  *   CHECK FOR PROPER SUPPLY VOLTAGES
251.0050    LOWV=0
251.0100    SETUP FOR VOLTAGE ON VDD TO VSS
251.0200    WAIT 1MS
251.0300    VDDMV=VOLTAGE
251.0350    UNSET FOR VOLTAGE ON VDD TO VSS
251.0400    IF (VDDMV LT 0.9*VDD) 251.11
251.0600    SETUP FOR VOLTAGE ON VCC TO VSS
251.0700    WAIT 1MS
251.0800    VCCMV=VOLTAGE
251.0850    UNSET FOR VOLTAGE ON VCC TO VSS
251.0900    IF (VCCMV LT 0.9*VCC) 251.13
251.1000    GO TO 251.15
251.1100    PRINT CR,"ERROR ON VDD = ",VDDMV," INSTEAD OF ",VDD
251.1150    LOWV=5
251.1200    GO TO 251.15
251.1300    PRINT "ERROR ON VCC ",VCCMV," INSTEAD OF ", VDD
251.1400    LOWV=6
251.1500    RETURN 1002.0000 *  IF SCREEN FULL (26 LINES) ERASE
1002.0010    LINES=LINES+1
1002.0020    IF(LINES LT 26) 1002.004
1002.0030    PRINT ERASE
1002.0035    LINES=0
1002.0040    RETURN 1003.0000 *  NEW PAGE ON SCREEN
1003.0010    LINES=0
1003.0015    IF(MODE EQ 0) 1003.008
1003.0020    PRINT ERASE
1003.0025    CALL 1002.0
1003.0030    IF(RESULT NE PASMSK) 1003.007
1003.0050    PRINT CR,"DEVICE PASSED"
1003.0060    GO TO 1003.008
1003.0070    PRINT CR,"DEVICE FAILED"
1003.0080    RETURN 1011.1600 *  GET A 16 BIT WORD FROM MDS220 DATA PORT
1011.1610 *  FIRST 8 IN LOW 8 OF IBD(50) 2ND 8 IN HIGH 8 OF IBD(50)
1011.1620    CALL 1011.8
1011.1630    IBD(50)=IBD(48)
1011.1640    CALL 1011.8
1011.1660    WD16=256*IBD(48)+IBD(50)
1011.1670    IF(WD16 LE 32767) 1011.169
1011.1680    WD16=WD16-65536
1011.1690    IBD(50)=WD16
1011.1695    RETURN
1011.3200 *  GET 32 BIT WORD FROM MDS220 DATA PORT
1011.3210 *  FIRST 16 IN IBD(49),2ND 16 IN IBD(50)
1011.3220    CALL 1011.16
1011.3230    TEMP=IBD(50)
1011.3240    CALL 1011.16
1011.3245    IBD(49)=IBD(50)
1011.3246    IBD(50)=TEMP
1011.3250 *  FPRD(25)=32 BIT WD
1011.3260    RETURN
1011.8000 *  GET AN 8 BIT WORD FROM MDS220 DATA PORT
1011.8010    SETBUS(CTSMSK,OPORT)
1011.8020    CALL 5.1
1011.8040    IF(SENT EQ 0) 1011.802
1011.8045    SETBUS(NOTCTS,OPORT)
1011.8046    CALL 5.1
1011.8049    IBD(48)=DA1
1011.8050 *  PRINT CR,"IBD(48)=",IBD(48)
1011.8051 *  WAIT TILL SENT=0
1011.8052    CALL 5.1
1011.8055    IF(SENT NE 0) 1011.8052
1011.8056    SETBUS(CTSMSK,OPORT)
1011.8060    RETURN
```

```
1012.0030 * PUT DATA ON BUS
1012.0040   SETBUS(IBD(49),OPORT)
1012.0050 * CTS=0 MEANS TAKE IT
1012.0060 * SETBUS(#000000,OPORT)
1012.0070 * LLLLLL
1012.0080 * CALL 5.1
1012.3200 * SEND FPBD(25) TO MDS220 IN K'S,UNITS (2 16B WDS.
1012.3210   IBD(50)=INT(FPBD(25)/1000)
1012.3220   CALL 1012.8
1012.3230   IBD(50)=FPBD(25)-1000*IBD(50)
1012.3240   CALL 1012.8
1012.3250   RETURN
1012.8000   RETURN 3000.0000 * LOOK AT BIT STREAMS
3000.0006   CALL 1003.0
3000.0010   CALL 1002.0
3000.0015   LINES=LINES+6
3000.0020   PRINT CR,"LOOK AT BIT STREAMS OPTIONS:"
3000.0030   PRINT CR,"    '1-DISPLAY PATTERN ON SCREEN"
3000.0040   PRINT CR,"     2-PRINT PATTERN TO LINE PRINTER"
3000.0045   PRINT CR,"     3-CREATE DUMMY FILE"
3000.0050   PRINT CR,"     4-RETURN TO MAIN MENUE"
3000.0060   PRINT CR,"     5-LOOK AT TIMING MARGIN FILE"
3000.0065   PRINT CR,"     6-HISTOGRAM OF LOGIC LEVEL STRING LENGTHS"
3000.0070   ACCEPT CR,"OPTION?",X
3000.0090   CALL (X) 3000.012,3000.162,3000.099,3000.011,3000.4,3000.5
3000.0095   IF(X EQ 4) 3000.011
3000.0100   GO TO 3000.0006
3000.0110   RETURN
3000.0120 * SHOW A PATTERN ON SCREEN
3000.0130   CALL 3000.227
3000.0131   CALL 3000.24
3000.0140 * GET NODE,PAT TO SHOW
3000.0150   CALL 1002.0
3000.0160   ACCEPT CR,"ENTER NODE # AND PATTERN # (N,P) TO BE DISPLAYED:",N,P
3000.0170   PRINT ERASE
3000.0180   LINES=0
3000.0190   CURSOR(0,200)
3000.0200   PRINT "FILE NAME: "
3000.0210   CURSOR(150,200)
3000.0220   STRNGO(TTY,IBUF,1,14)
3000.0230   PRINT CR,"NODE=",N:I5C," PATTERN=",P:I2C
3000.0240   FPBD(25)=FTARY(NAME1,N,1)
3000.0250   PRINT CR,"X=",IBD(49):I5C," Y=",IBD(50):I5C
3000.0260   X=FTARY(NAME1,N,2)
3000.0270   PRINT CR,"CYCLE/PAT =",INT(X/16),"/",X-16*INT(X/16)
3000.0280   PRINT CR,"DATE OF TEST: ",IBD(3):I3,"-",IBD(4):I3,"-",IBD(2):I3
3000.0290   PRINT CR,"DEVICE SERIAL #:",IBD(5):I6
3000.0300 * POINT TO FIRST WORD IN NODE,PAT
3000.0310   WD=4
3000.0330   LOOP 3000.037 X2=1,13
3000.0340   IF(X2 EQ P) 3000.038
3000.0350   N8=INT((PL(X2)+7)/8)
3000.0360   WD=WD+INT((N8+3)/4)
3000.0370   CONTINUE
3000.0380 * READY FOR FIRST WORD FETCH IF B1=33 (1-32)
3000.0390   B1=33
3000.0400 * INITIALIZE BITNUM BIT COUNTER
3000.0410   BITNUM=1
3000.0420 * FIGURE TOTAL # BITS TO BE DISPLAYED
3000.0430   B2=PL(P)
3000.0440 * NOW GET ORIENTED WITH SCREEN VARIABLES
3000.0450 * E=# BITS PER LINE ON SCREEN
3000.0460   E=7*16
3000.0470 * DX,DY ARE SPACING OF BITS/LINE AND LINES
3000.0480   DX=7
3000.0490   DY=1.4*DX
3000.0500   LOOP 3000.089 LY=750,100,-2.0*DY
3000.0510   CURSOR(0,LY)
3000.0520   PRINT BITNUM:I4
3000.0530   X=100
```

```
3000.0540     Y=LY
3000.0550  *  DO A LINE
3000.0560     DRAW(X,Y,0)
3000.0570     DRAW(X,Y,1)
3000.0580     LOOP 3000.087 I=1,E
3000.0590  *  HERE BITNUM=# OF NEXT BIT TO GO TO SCREEN
3000.0600     IF(BITNUM GT 82) 3000.09
3000.0610     IF(BITNUM/8 NE INT(BITNUM/8)) 3000.067
3000.0620     DRAW(X,Y,0)
3000.0630     VECTRF(X,LY,X,LY-3)
3000.0640     DRAW(X,Y,0)
3000.0650     DRAW(X,Y,1)
3000.0660  *  EXTRACT A BIT
3000.0670     IF(B1 NE 33) 3000.077
3000.0680     B1=1
3000.0690     FPBD(25)=FTARY(NAME1,N,WD)
3000.0700     WD=WD+1
3000.0710  *  BREAK INTO 32 BITS
3000.0720     CALL 3000.3
3000.0770     BIT=IBD(15+B1)
3000.0780     B1=B1+1
3000.0790     BITNUM=BITNUM+1
3000.0800     IF(BIT NE 0) 3000.083
3000.0810     Y=LY
3000.0820     GO TO 3000.084
3000.0830     Y=LY+DY
3000.0840     DRAW(X,Y,1)
3000.0850     X=X+DX
3000.0860     DRAW(X,Y,1)
3000.0870     CONTINUE
3000.0880     DRAW(X,Y,0)
3000.0890     CONTINUE
3000.0900     CLARY(NAME1,0)
3000.0910     CURSOR(0,240)
3000.0920     ACCEPT CR,"NEXT PATTERN (0-NO  1-YES) ?",CHAR
3000.0930     IF(CHAR NE 1) 3000.098
3000.0940     P=P+1
3000.0950     IF(P NE 14) 3000.017
3000.0960     PRINT "THAT WAS THE LAST PATTERN, PRESS RET TO CONTINUE"
3000.0970     CHAR=CHARI(TTY)
3000.0980     RETURN
3000.0990  *  TEST TO CREATE DUMMY BIT STREAM FILE
3000.1000     CALL 1002.0
3000.1010     PRINT CR,"ENTER FILE NAME (6 CHARS):"
3000.1020     STRNGI(TTY,COUNT,IBUF,1,6)
3000.1030     SCON(IBUF,6,14,"H.ARY:470")
3000.1040     PFST=1
3000.1050     PAKFIL(NAME1,PDUM,IBUF,PFST,14)
3000.1060     IBD(1)=14
3000.1070     IBD(2)=83
3000.1080     IBD(3)=12
3000.1090     IBD(4)=14
3000.1100     IBD(5)=1
3000.1110     CALL 1002.0
3000.1120     ACCEPT CR,"ENTER # NODES:",I
3000.1121     IBD(6)=1
3000.1130     IBD(7)=3332
3000.1140     LOOP 3000.116 I=8,14
3000.1150     IBD(I)=STRNGF(IBUF,I-7)
3000.1160     CONTINUE
3000.1170     L1=14
3000.1180     DCLARY(NAME1,0,L1,1)
3000.1190     LOOP 3000.121 I=1,14
3000.1200     STARY(IBD(I),NAME1,I,1)
3000.1210     CONTINUE
3000.1220     CLARY(NAME1,0)
3000.1230     CALL 1002.0
3000.1240     PRINT CR,"HEADER OUT"
3000.1250  *  DATA ARRAY XY'S,PAT/CYC,STREAMS
3000.1260     SCON(IBUF,6,6,"D")
3000.1270     PFST=1
3000.1280     PAKFIL(NAME1,PDUM,IBUF,PFST,14)
```

```
3000.1290    L1=3
3000.1310    LOOP 3000.134 P=1,13
3000.1320    N8=INT((PL(P)+7)/8)
3000.1330    L1=L1+INT((N8+3)/4)
3000.1340    CONTINUE
3000.1350    DCLARY(NAME1,0,IBD(6),L1)
3000.1360  * FIRST XY'S,PAT/CYC , FMAX'S, THEN STREAMS
3000.1370    LOOP 3000.142 J=1,IBD(6)
3000.1380    IBD(50)=10*I
3000.1390    IBD(49)=I
3000.1400    STARY(FPBD(25),NAME1,I,1)
3000.1410    STARY(FPBD(25),NAME1,I,2)
3000.1415    STARY(FPBD(25),NAME1,I,3)
3000.1420    CONTINUE
3000.1430    CALL 1002.0
3000.1440    PRINT CR,"XY'S, PAT/CYC'S STORED"
3000.1450    WD=4
3000.1460    LOOP 3000.159 N=1,IBD(6)
3000.1470    LOOP 3000.158 P=1,13
3000.1480    CALL 1002.0
3000.1490    PRINT CR,"STORING NODE",N:I3," PATTERN",P:I3
3000.1500    N8=INT((PL(P)+7)/8)
3000.1510    N32=INT((N8+3)/4)
3000.1520    LOOP 3000.157 I=1,N32
3000.1530    IBD(50)=#125252
3000.1540    IBD(49)=#125252
3000.1550    STARY(FPBD(25),NAME1,N,WD)
3000.1560    WD=WD+1
3000.1570    CONTINUE
3000.1580    CONTINUE
3000.1590    CONTINUE
3000.1600    CLARY(NAME1,0)
3000.1610    RETURN
3000.1620  * PRINT A STREAM TO LINE PRINTER
3000.1628    CALL 3000.227
3000.1629    CALL 3000.24
3000.1630    PRINT <LP> CR
3000.1631    PRINT <LP> "FILE NAME: "
3000.1632    STRNGO(LP,IBUF,1,14)
3000.1633    PRINT <LP> CR,"DATE OF TEST: ",IBD(3):I2,"-",IBD(4):I2,"-",IBD(2):I2
3000.1634    PRINT <LP> CR,"DEVICE SERIAL #:",IBD(5):I6
3000.1635    LOOP 3000.22 N=1,IBD(6)
3000.1636    WD=4
3000.1637    FPBD(25)=FIARY(NAME1,N,1)
3000.1638    PRINT <LP> CR,"NODE #: ",N:I3," X: ",IBD(49):I5," Y: ",IBD(50):I5
3000.1639    X=FTARY(NAME1,N,2)
3000.1640    PRINT <LP> CR,"1ST OFF AT PATTERN #:",X-16*INT(X/16)," BIT #:",INT(X/16)
3000.1641    LOOP 3000.22 P=1,13
3000.1642    PRINT <LP> CR
3000.1643    PRINT <LP> CR,"PATTERN #:",P:I2
3000.1840  * READY FOR FIRST WORD FETCH IF B1=33 (1-32)
3000.1850    B1=33
3000.1860  * INITITALIZE BIT COUNTER (1-PL(P))
3000.1870    BITNUM=1
3000.1900  * NOW GET ORIENTED WITH SCREEN VARIABLES
3000.1910  * E=# BITS PER LINE ON PAGE
3000.1920    E=7*16
3000.1940    PRINT <LP> CR, BITNUM:I4C," "
3000.1950    LOOP 3000.214 I=1,E
3000.1955    IF(INT((I-1)/8) NE (I-1)/8) 3000.196
3000.1956    PRINT <LP> " "
3000.1960    IF(BITNUM GT PL(P)) 3000.22
3000.1970  * EXTRACT A BIT
3000.1980    IF(B1 NE 33) 3000.208
3000.1990    B1=1
3000.2000    FPBD(25)=FTARY(NAME1,N,WD)
3000.2010    WD=WD+1
3000.2020  * BREAK TO BITS
3000.2030    CALL 3000.3
3000.2080    BIT=IBD(15+B1)
3000.2090    B1=B1+1
3000.2100    BITNUM=BITNUM+1
```

```
3000.2130     PRINT <LP> BIT:11C
3000.2140     CONTINUE
3000.2150     GO TO 3000.194
3000.2200     CONTINUE
3000.2205     CLARY(NAME1,0)
3000.2206     RETURN
3000.2250     CLARY(NAME1,0)
3000.2260     RETURN
3000.2270   * GET FILE NAME, OPEN HEADER,RECOVER,OPEN DATA
3000.2280   * RECOVER HEADER FILE
3000.2290     CALL 1002.0
3000.2300     PRINT CR,"ENTER FILE NAME (6 CHARS):"
3000.2310     STRNGI(TTY,COUNT,IBUF,1,6)
3000.2320     SCON(IBUF,6,14,"H.ARY:470")
3000.2330     PFST=1
3000.2340     PAKFIL(NAME1,PDUM,IBUF,PFST,14)
3000.2350     OCLARY(NAME1,0,14,1)
3000.2360     LOOP 3000.238 I=1,14
3000.2370     IBD(I)=FTARY(NAME1,I,1)
3000.2380     CONTINUE
3000.2390     CLARY(NAME1,0)
3000.2395     RETURN
3000.2400   * OPEN DATA FILE
3000.2410     L1=3
3000.2430     LOOP 3000.245 P=1,13
3000.2440     NB=INT((PL(P)+7)/8)
3000.2450     L1=L1+INT((NB+3)/4)
3000.2460     CONTINUE
3000.2510     SCON(IBUF,6,14,"D.ARY:470")
3000.2520     PFST=1
3000.2530     PAKFIL(NAME1,PDUM,IBUF,PFST,14)
3000.2540     OCLARY(NAME1,0,IBD(6),L1)
3000.2550     RETURN
3000.2600   *
3000.3000   * BREAK IBD(49),IBD(50) INTO BITS IN IBD(47-16)
3000.3010     LOOP 3000.306 I1=50,49,-1
3000.3020     BITMSK=#000001
3000.3030     LOOP 3000.306 B3=16+(50-I1)*16,31+(50-I1)*16
3000.3040     IBD(B3)=AND(BITMSK,IBD(I1))
3000.3045     IF(IBD(B3) EQ 0) 3000.305
3000.3046     IBD(B3)=1
3000.3050     SHIFT(BITMSK,+1)
3000.3060     CONTINUE
3000.3070     RETURN
3000.4000   * LOOK AT TIMING MARGIN FILE
3000.4010     CALL 3000.227
3000.4020     PFST=1
3000.4030     SCON(IBUF,6,6,"D")
3000.4040     PAKFIL(NAME1,PDUM,IBUF,PFST,14)
3000.4050     OCLARY(NAME1,0,IBD(6),3)
3000.4060     LOOP 3000.41 N=1,IBD(6)
3000.4080     FPHD(25)=FTARY(NAME1,N,1)
3000.4082     X=IBD(49)
3000.4084     Y=IBD(50)
3000.4086     CP=FTARY(NAME1,N,2)
3000.4088     TOTAL=INT(CP/16)
3000.4090     P=CP-16*TOTAL
3000.4092     FMAX=FTARY(NAME1,N,3)
3000.4094     CALL 1002.0
3000.4096     PRINT CR,"X,Y,P,CYC,FMAX=",X,Y,P,TOTAL,FMAX
3000.4100     CONTINUE
3000.4110     CLARY(NAME1,0)
3000.4120     RETURN
3000.5000   * DRAW HISTOGRAM OF LOGIC LEVEL STRING LENGTHS
3000.5011   * CLEAR HISTO DATA
3000.5012     LOOP 3000.5013 X=1,512
3000.5013     HISTO(X)=0
3000.5015   * GET FILE NAME AND HEADER FILE IN
3000.5020     CALL 3000.227
3000.5030   * OPEN DATA FILE (NAME1)
3000.5040     CALL 3000.24
3000.5050     CALL 1002.0
```

```
3000.5060    ACCEPT CR,"ENTER NODE #:",N
3000.5070    P=1
3000.5080    PRINT CR,"DOING PATTERN ",P:I2C
3000.5090  * N1=# BITS DONE, B1=BIT # POINTER (1-32), L1=STRING LENGTH
3000.5100    N1=1
3000.5110    B1=1
3000.5130  * POINT TO FIRST WORD IN PATTERN P
3000.5140    WD=4
3000.5150    LOOP 3000.519 X2=1,13
3000.5160    IF(X2 EQ P) 3000.52
3000.5170    NB=INT((PL(P)+7)/8)
3000.5180    WD=WD+INT((NB+7)/4)
3000.5190    CONTINUE
3000.5200  * FETCH WORD AND BREAK TO BITS
3000.5210    FPBD(25)=FTARY(NAME1,N,WD)
3000.5220    CALL 3000.3
3000.5230    BIT1=IBD(B1+15)
3000.5240    L1=0
3000.5250    N1=N1+1
3000.5255    IF(N1 GT PL(P)) 3000.553
3000.5260    L1=L1+1
3000.5270    B1=B1+1
3000.5280    IF(B1 LE 32) 3000.532
3000.5285    B1=1
3000.5290    WD=WD+1
3000.5300    FPBD(25)=FTARY(NAME1,N,WD)
3000.5310    CALL 3000.3
3000.5320    BIT2=IBD(15+B1)
3000.5330    IF(BIT1 EQ BIT2) 3000.525
3000.5430    X=L1
3000.5440    IF(X LE 100) 3000.546
3000.5450    X=100
3000.5460    HISTO(X)=HISTO(X)+1
3000.5470  * PRINT CR,"HISTO(",X:I3C,")=",HISTO(X):I4C
3000.5480    IF(HISTO(X) LE 100) 3000.55
3000.5490    HISTO(X)=100
3000.5500    GOTO 3000.5230
3000.5530    P=P+1
3000.5540    IF(P LE 13) 3000.508
3000.5550  * DRAW HISTOGRAM
3000.5555    PRINT ERASE
3000.5560    YMIN=200
3000.5570    YMAX=700
3000.5580    XMIN=200
3000.5590    XMAX=700
3000.5600    VECTRF(XMIN,YMIN,XMIN,YMAX)
3000.5610    VECTRF(XMIN,YMIN,XMAX,YMIN)
3000.5620    NLAB=5
3000.5630    LOOP 3000.569 X=1,NLAB
3000.5640    XPOS=XMIN+(XMAX-XMIN)*(X-1)/(NLAB-1)
3000.5650    XVAL=(100-0)*(X-1)/(NLAB-1)
3000.5660    VECTRF(XPOS,YMIN,XPOS,YMIN-10)
3000.5670    CURSOR(XPOS-2*14,YMIN-30)
3000.5680    PRINT XVAL:I4C
3000.5690    CONTINUE
3000.5700    LOOP 3000.576 X=1,NLAB
3000.5710    YPOS=YMIN+(YMAX-YMIN)*(X-1)/(NLAB-1)
3000.5720    YVAL=0+(100-0)*(X-1)/(NLAB-1)
3000.5730    VECTRF(XMIN-10,YPOS,XMIN,YPOS)
3000.5740    CURSOR(XMIN-5*14,YPOS-0.5*22)
3000.5750    PRINT YVAL:I4C
3000.5760    CONTINUE
3000.5770    CURSOR(10,YMAX+75)
3000.5780    PRINT "HISTOGRAM OF LENGTH OF LOGIC LEVEL STRINGS FOR FILE:"
3000.5790    STRNGO(TTY,IBUF,1,10)
3000.5800    PRINT " NODE:",N1:I2C
3000.5805    CURSOR(0,450)
3000.5806    PRINT "FREQUENCY"
3000.5807    CURSOR(XMIN+50,YMIN-60)
3000.5808    PRINT "LENGTH OF LEVEL (BITS)"
3000.5810    LOOP 3000.587 X=1,99
```

```
3000.5820    X1=XMIN+5*X
3000.5840    Y1=YMIN+(YMAX-YMIN)*(HISTO(X)-0)/(100-0)
3000.5860    VECTRF(X1,YMIN,X1,Y1)
3000.5870    CONTINUE
3000.5880    CURSOR(XMIN,YMIN-100)
3000.5890    ACCEPT "PRESS RETURN TO CONTINUE",X
3000.5895    CLARY(NAME1,0)
3000.5900    RETURN
```

We claim:

1. A method of characterizing critical timing paths and analyzing timing related failure modes in an integrated circuit by ascertaining the timing margin of a transistor of said integrated circuit, said method comprising the steps of:
   (a) focusing and preselectively applying a beam of electromagnetic radiation of preselected intensity onto a particular spot on said transistor of said integrated circuit;
   (b) functionally testing said transistor a first time to determine the ON or OFF state of said transistor during each clock period of said transistor;
   (c) storing information on said ON or OFF state of said transistor for each of said clock periods of said transistor;
   (d) functionally testing said transistor a second time with said beam of electromagnetic radiation being applied to said particular spot on said transistor only when said transistor will be in said OFF state during the next clock period as determined from stored information;
   (e) determining the time required for said transistor to reach said OFF state;
   (f) analyzing said determined time required for said transistor to reach said OFF state in order to ascertain said timing margin of said transistor; and
   (g) utilizing said timing margin in order to analyze the operation of said integrated circuit.

2. The method as defined in claim 1 further including the step of varying the intensity of said beam of electromagnetic radiation while functionally testing said transistor a second time.

3. The method as defined in claim 1 wherein steps a–g are repeated on a particular spot of another transistor of said integrated circuit.

4. The method as defined in claim 1 wherein said spot is a drain junction of said transistor.

5. The method as defined in claim 1 wherein said beam of electromagnetic radiation is produced by a laser.

6. The method as defined in claim 1 wherein said step of functionally testing said transistor a first time includes the steps of:
   (a) comparing supply current to said integrated circuit during each of said clock periods under two different conditions, one condition being with said beam of electromagnetic radiation applied to said transistor and the other condition with said beam of electromagnetic radiation not being applied to said transistor; and
   (b) comparing a difference in said supply current under each of said conditions to determine said ON or OFF state of said transistor.

7. The method as defined in claim 6 further including the step of varying the intensity of said beam of electromagnetic radiation while functionally testing said transistor a second time.

8. The method as defined in claim 7 wherein said spot is a drain junction of said transistor.

9. The method as defined in claim 8 wherein said beam of electromagnetic radiation is produced by a laser.

10. The method as defined in claim 9 wherein steps a–g are repeated on a particular spot of another transistor of said integrated circuit.

11. A method of characterizing critical timing paths and analyzing timing related failure modes in an integrated circuit by ascertaining the relative timing margins of preselected circuit elements of said integrated circuit, said method comprising the steps of:
   (a) focusing and preselectively applying a beam of electromagnetic radiation of preselected intensity onto a preselected spot on a circuit element of said integrated circuit;
   (b) selecting a set of test conditions, including preselected values of power supply voltage, radiation beam intensity, and clock frequency capable of causing reduced timing margins in said integrated circuit;
   (c) functionally testing said integrated circuit using said set of preselected values of said test conditions and determining whether said circuit passes or fails;
   (d) repeating steps (b) and (c) with different values for said set of test conditions until said timing margins become so critically low that said integrated circuit fails said functional test;
   (e) repeating steps (a), (b), (c), and (d) at a preselected spot on a mulitplicity of other circuit elements of said integrated circuit; and
   (f) determining the relative timing margins of all of said circuit elements by ranking said timing margins according to said values of said test conditions for which said integrated circuit fails said functional test.

12. The method as defined in claim 11 wherein said beam of electromagnetic radiation is produced by a laser.

13. The method as defined in claim 11 wherein said preselected spot of said integrated circuit comprises a drain junction of a transistor.

14. The method as defined in claim 11 wherein said preselected spot of said integrated circuit comprises a collector of a transistor.

15. The method as defined in claim 11 wherein said step of functionally testing said integrated circuit includes:
   (a) functionally testing said integrated circuit a first time to determine information on the sequence of the ON or OFF state of said preselected circuit element during each clock period of said functional test;
   (b) storing said information of said sequence of said ON or OFF state of said circuit element for each of said clock periods; and (c) functionally testing said integrated circuit a multiplicity of additonal times with said different values of said set of test conditions and with said beam of electromagnetic radiation being applied only when said preselected circuit element is in said OFF state during the next clock period as determined from said stored information.

16. The method as defined in claim 15 wherein said beam of electromagnetic radiation is produced by a laser.

17. The method as defined in claim 15 wherein said preselected spot of said integrated circuit comprises a drain junction of a transistor.

18. The method as defined in claim 15 wherein said preselected spot of said integrated circuit comprises a collector of a transistor.

19. The method as defined in claim 15 wherein said step of functionally testing said integrated circuit said first time further includes the steps of:
   (a) measuring supply current to said integrated circuit during each of said clock periods of said functional test under two different conditions, one condition being with said beam of electromagnetic radiation appled to said preselected spot of said circuit element and another condition being with said beam of electromagnetic radiation not being applied to said preselected spot of said circuit element; and
   (b) comparing the differences in said supply current under each of said conditions to determine said ON or OFF state of said circuit element.

* * * * *